(12) United States Patent
Komorita et al.

(10) Patent No.: US 6,232,657 B1
(45) Date of Patent: May 15, 2001

(54) SILICON NITRIDE CIRCUIT BOARD AND SEMICONDUCTOR MODULE

(75) Inventors: Hiroshi Komorita; Kazuo Ikeda; Michiyasu Komatsu; Yoshitoshi Sato, all of Yokohama; Takayuki Naba, Chigasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/051,477

(22) PCT Filed: Aug. 19, 1997

(86) PCT No.: PCT/JP97/02870

§ 371 Date: Apr. 17, 1998

§ 102(e) Date: Apr. 17, 1998

(87) PCT Pub. No.: WO98/08256

PCT Pub. Date: Feb. 26, 1998

(30) Foreign Application Priority Data

| Aug. 20, 1996 | (JP) | .................................................. 8-218725 |
| Sep. 18, 1996 | (JP) | .................................................. 8-246449 |
| Sep. 20, 1996 | (JP) | .................................................. 8-250023 |

(51) Int. Cl.⁷ .................................................. H01L 23/053
(52) U.S. Cl. ......................... 257/700; 257/713; 257/723
(58) Field of Search .................................. 257/700, 713, 257/723, 724, 725, 784, 705

(56) References Cited

U.S. PATENT DOCUMENTS

| 5,439,856 | 8/1995 | Michiyasu et al. . |
| 5,561,321 | 10/1996 | Hirano et al. . |
| 5,672,848 | 9/1997 | Komorita et al. . |
| 5,698,896 | * 12/1997 | Komatsu et al. .................... 257/705 |
| 5,698,898 | * 12/1997 | Matsumoto .......................... 257/712 |
| 5,721,455 | * 2/1998 | Takashita .............................. 257/712 |

FOREIGN PATENT DOCUMENTS

| 0 339 881 | 11/1989 | (EP) . |
| 0 476 971 | 3/1992 | (EP) . |
| 0 660 397 | 6/1995 | (EP) . |
| 0 766 307 | 3/1996 | (EP) . |
| 6-13726 | 1/1994 | (JP) . |
| 6-21263 | 1/1994 | (JP) . |
| 7-149588 | 6/1995 | (JP) . |

* cited by examiner

*Primary Examiner*—Roy Potter
(74) *Attorney, Agent, or Firm*—Oblon, Spivak, McClelland, Maier & Neustadt, P.C.

(57) ABSTRACT

There is provided a semiconductor module which comprises a high thermal conductive silicon nitride substrate 10 having a thermal conductivity of 60 w/m·k or more, a semiconductor element 7 mounted on this high thermal conductive silicon nitride substrate 10, metal circuit plates 3 which are bonded on the semiconductor element-mounted side of this high thermal conductive silicon nitride substrate 10 and single metal plate 4a which is bonded to a side opposing to the semiconductor element-mounted side of this high thermal conductive silicon nitride substrate and is bonded on an apparatus casing 9 or a mounting board. By this constitution, there can be provided a semiconductor module having a simple structure, which can be miniaturized, and having an improved structure strength and an excellent heat cycle resistance property without requiring a heat sink plate or the like.

24 Claims, 4 Drawing Sheets

SILICON NITRIDE CIRCUIT BOARD AND SEMICONDUCTOR MODULE

BACKGROUND OF THE INVENTION

1. Field of the Invention

The present invention relates to a silicon nitride circuit board and a semiconductor module which is useful as a semiconductor mounted circuit board, semiconductor package and the like.

2. Description of the Related Art

Recently, a ceramic circuit board prepared by bonding a metal plate (metal circuit plate) such as a copper plate to a ceramic plate is used as a substrate for mounting of a semiconductor module such as a power transistor module or semiconductor parts dealing relatively high electric power such as a switching current source module and the like.

As a bonding method of a ceramic substrate with a metal plate cut out in given shape in a production process for the ceramic circuit board as described above, a method using an active metal brazing material (active metal method) prepared by adding 1 to 10 wt. % of active metal such as Ti, Zr, Hf, Nb and the like to an Ag—Cu brazing material and the like, a so-called direct bonding method (DBC method: direct bonding copper method) in which a ceramic substrate is directly bonded to a copper plate using tough pitch electrolytic copper containing 100 to 1000 ppm oxygen or copper of which surface is oxidized in a thickness of 1 to 10 μm as a metal plate, and the like are known.

For example, in the direct bonding method, a 0.3 to 0.5 mm thick copper circuit plate cut out in given shape is first contacted and placed on a 0.6 to 1.0 mm thick ceramic substrate composed of an aluminum oxide ($Al_2O_3$) sintered material, aluminum nitride (AlN) sintered material and the like, and heated for formation of eutectic crystal liquid phase of $Cu—Cu_2O$ on bonding interface, the surface of the ceramic substrate is wetted with this liquid phase, then, the liquid phase is cooled to be solidified for direct bonding of the ceramic substrate with the copper circuit plates. The ceramic circuit board obtained by using such a direct bonding method has advantages such as possibility of small size and high-density mounting, and the like, since bonding strength between the ceramic substrate with the copper circuit plates is high and it has simple structure in which a metallized layer or brazing material layer is not required. Further, the production process is intended to be shortened.

However, the above-described ceramic circuit board prepared by bonding a metal plate to a ceramic substrate by the direct bonding method, active metal method and the like has a problem that reliability is poor in heat history, since the metal plate has as large as 0.3 to 0.5 mm thickness for flowing large current. Namely, a ceramic substrate and a metal plate having extremely different heat expansion coefficients are bonded, heat stress derived from the above-described difference in heat expansion coefficient occurs by adding a cooling process and cooling cycle after the bonding. This stress exists in the form of remaining stress distribution of compression and tension on the ceramic substrate side near the bonding portion, and particularly, main stress of the remaining stress acts on ceramic portion adjacent to periphery end of the metal plates. This remaining stress causes cracking on the ceramic substrate, poor withstand voltage, releasing of the metal plate. Further, it exerts a reverse influence that strength of the ceramic substrate is lowered, even if no cracking occurs on the ceramic substrate.

With recent development of high density and highly integrated semiconductor element, miniaturization of a semiconductor module and electronic parts themselves is desired. Under these circumstances, miniaturization of the semiconductor mounted substrate per se is also required.

By the way, an aluminum nitride substrate has a high thermal conductivity and low heat expansion property as compared with other ceramic substrates. However, no aluminum nitride substrate having a sufficient mechanical strength has not been obtained yet. Therefore, when a slight pressure or impact is imparted to the circuit board in mounting process of the circuit board, the circuit board is easily destroyed, and production yield of a semiconductor apparatus is sometimes reduced steeply.

Therefore, in a conventional semiconductor module, it is essential factor to increase thickness of a ceramic substrate and integrate a reinforcing member with a circuit board. FIG. 4 is a cross-sectional view showing structure of such a conventional semiconductor module 101. The semiconductor module 101 shown in FIG. 4 has a large thickness, and is formed by bonding metal circuit plates 103 to a front surface of a ceramic substrate 102 made of an AlN sintered body having a high thermal conductivity, and at the same time by bonding a metal plate 104 as a backing copper plate to the rear surface of the ceramic substrate 102. Further, a semiconductor element 107 is mounted on a predetermined position of the metal circuit plate 103 by solder bonding, and an electrode portion of the metal circuit plate 103 and the semiconductor element 107 are electrically connected by a bonding wire 108.

The ceramic circuit board constructed as described above is integrated to the surface of a heat sink plate 105 made of, for example, copper by solder bonding, and a semiconductor module 101 as shown in FIG. 4 is formed. This semiconductor module 101 is fixed on an apparatus casing 109, a heat releasing fin or a mounting board by securing with an attaching screw 106.

However, the above-described conventional semiconductor module 101 or ceramic circuit board has problems that size becomes large when constructed as a semiconductor module and it is difficult to produce a small size module, and production cost for a ceramic substrate increases. In addition, since a heat sink plate which improves heat releasing property and prevents cracking of the ceramic substrate is required, and further, since it is necessary to use a ceramic substrate having a large thickness for enhancing resistance against cracking. Further, since thickness of the substrate increases, there is a problem that heat resistance increases and excellent heat releasing property as expected cannot be obtained even if an AlN substrate having a high thermal conductivity is used.

The present invention has been accomplished to cope with such problems, and a first object thereof is to provide a semiconductor module which does not require both a rear copper plate (rear metal plate) and a heat sink plate, of which structure is simple and can be miniaturized, and of which heat releasing property and heat cycle durability are improved.

On the other hand, with recent development of high density and highly integrated semiconductor element, miniaturization of a semiconductor module and electronic parts themselves is desired, and for high densely mounting, an enlargement of area for mounting part and circuit constituting part is desired.

However, in the conventional ceramic circuit board, since one main surface of a ceramic substrate is only used as a mounting surface, it is necessary to enlarge the ceramic substrate itself for increasing mounting part and circuit constituting part. When the ceramic substrate is enlarged, however, there may be posed problems that the ceramic substrate tends to bend in bonding process for bonding the copper circuit plates and the like. Further, simple enlargement of the ceramic substrate goes against the requirement for miniaturization of a mounting substrate and the electronic parts themselves.

As described above, in the conventional ceramic circuit board, the ceramic substrate should be enlarged for increasing the area of mounting part and the circuit constitutional part, and this invites poor bonding of the copper circuit plates and goes against requirement for miniaturization of the electronic parts. Further, with diversification of the semiconductor element, various properties are required for a semiconductor mounting substrate and semiconductor package, and it is desired to satisfy the various requirements.

On the other hand, high densely integration, high power performance and enlargement of a semiconductor element have been developed, and circuit board structure which can effectively dissipate heat generated from the semiconductor element outside of the system and circuit board structure having a high strength which can endure heat stress are technically required. Then, a silicon nitride ($Si_3N_4$) substrate having higher strength than that of a conventional alumina ($Al_2O_3$) substrate has been tried to be used as a ceramic substrate. However, since the $Si_3N_4$ substrate has a remarkably lower thermal conductivity as compared with an aluminum nitride substrate and the like though it has excellent mechanical strength such as toughness and the like. Therefore, the $Si_3N_4$ substrate is not practically used as a constitutional material of a circuit board for a semiconductor to which heat releasing property is particularly required.

On the other hand, the aluminum nitride (AlN) substrate has a higher thermal conductivity and lower heat expansion property as compared with other ceramic substrates, no aluminum nitride substrate having satisfactory mechanical strength has not been obtained yet.

Therefore, when slight pressure or impact is imparted to AlN substrate in mounting process of a circuit board, the circuit board is easily destroyed, and production yield of a semiconductor device is sometimes reduced steeply.

Therefore, in the conventional ceramic circuit board, it is essential requirement to increase thickness of the ceramic substrate. FIG. 7 is a cross-sectional view showing structure of such a conventional ceramic circuit board 201. The ceramic circuit board 201 as shown in FIG. 7 has a large thickness, and is formed by bonding two ceramic substrates 202a, 202b made of an AlN sintered body having a high thermal conductivity through a copper plate 204 as a metal circuit plate, by bonding a copper plate 203 to the upper surface of the ceramic substrate 202b, and by simultaneously bonding a metal plate 205 as a rear copper plate to the rear surface of the ceramic substrate 202a for integration. At a predetermined portion of the copper plate 203, a semiconductor element 207 is mounted by solder bonding, and an electrode portion of the copper plate 203 and the semiconductor element 207 are electrically connected by a bonding wire 208.

As described above, the above-described conventional ceramic (AlN) circuit board 201 has problems that the size is large when constructed as a semiconductor module and it is difficult to produce a small size module, and production cost for a ceramic substrate increases, since it is necessary to use ceramic substrates 202a, 202b each having a large thickness for improving the resistance against cracking. Further, since thickness of the substrate increases, there is a problem that heat resistance increases and excellent heat releasing property as expected cannot be obtained even if an AlN substrate having a high thermal conductivity is used.

The present invention has been accomplished to cope with such problems, and a second object thereof is to provide a silicon nitride circuit board which has an excellent heat releasing property, can enlarge area of mounting part and circuit constituting parts and can be miniaturized, and further, which has an improved heat cycle durability and excellent reliability.

DISCLOSURE OF THE INVENTION

The semiconductor module of the present invention comprises a high thermal conductive silicon nitride substrate having a thermal conductivity of 60 w/m·k or more, a semiconductor element mounted on this high thermal conductive silicon nitride substrate, metal circuit plates that are bonded to the high thermal conductive silicon nitride substrate at a side to which a semiconductor element is mounted, and single metal plate which is bonded to the high thermal conductive silicon nitride substrate at a side to which the semiconductor element is not mounted and is bonded to an apparatus casing or a mounting board.

As a preferable embodiment of the above-described semiconductor module of the present invention, there are listed an embodiment in which the thickness of the metal plate which is bonded to the apparatus casing or the mounting board is less than that of the above-described metal circuit plate, an embodiment in which a thickness of the metal plate which is bonded to the apparatus casing or the mounting board is more than two times of that of the above-described metal circuit plate, an embodiment in which the above-described metal plate is bonded to the above-described high thermal conductive silicon nitride substrate by a direct bonding method, and further, an embodiment in which the above-described metal plate is bonded to the above-described high thermal conductive silicon nitride substrate by an active metal brazing method.

The silicon nitride circuit board of the present invention comprises a plurality of high thermal conductive silicon nitride substrates each having a thermal conductivity of 60 w/m·k or more and a metal plate which is bonded to this highly thermal conductive silicon nitride substrate, and has a part in which a plurality of the high thermal conductive silicon nitride substrates form a plural-layered structure through the metal plate.

As a more preferable embodiment of the above-described silicon nitride circuit, board, there can be provided an embodiment in which the above-described metal plate is bonded to the high thermal conductive silicon nitride substrate by a direct bonding method, and an embodiment in which the metal plate is bonded to the high thermal conductive silicon nitride substrate by an active metal brazing method.

Further, in the silicon nitride circuit board of the present invention, a high thermal conductive silicon nitride substrate having a thermal conductivity of 60 w/m·k or more and a substrate having a thermal conductivity of less than 60 w/m·k are provided on the same plane, and metal circuit plates are bonded to at least the high thermal conductive silicon nitride substrate having a thermal conductivity of 60 w/m·k or more.

As the substrate having a thermal conductivity of less than 60 w/m·k, an alumina ($Al_2O_3$) substrate, resin substrate and the like can be used.

A metal plate may advantageously bonded to the high thermal conductive silicon nitride substrate having a thermal conductivity of 60 w/m·k or more and a cheap substrate for general use having a thermal conductivity of less than 60 w/m·k which can be easily produced through an oxidized layer formed on rear surfaces of the respective substrate. Further, a metal plate may also be directly bonded to both the high thermal conductive silicon nitride substrate and the cheap substrate for general use through the oxidized layer so that the metal plate extends to both substrate.

Namely, according to the present invention, it becomes possible to obtain a cheap circuit board which can be easily produced with maintaining an excellent strength and heat releasing property. Namely, a complex silicon nitride circuit board can be obtained by combining a silicon nitride substrate excellent in thermal conductivity, strength and toughness with a cheap substrate for general use which can be easily produced.

Arrangement of the above-described high thermal conductive silicon nitride substrate and the substrate having a thermal conductivity of less than 60 w/m·k is roughly classified into the following three types. Namely, there are three embodiments; an embodiment in which the both substrates are placed so as to be adjacent to each other on the same plane; an embodiment in which the both substrates are laminated so as to form a sandwich-structure, and an embodiment in which a plurality of high thermal conductive silicon nitride substrates are placed on a surface of an alumina substrate or a resin substrate.

These embodiments may be combined in accordance with the required properties.

For example, an excellent heat releasing property of whole circuit board can be secured by arranging the high thermal conductive silicon nitride substrate to a portion on which a semiconductor element as a highly heat generating part is mounted. Further, when a surface portion of the circuit board to which mechanical pressure, mechanical stress and the like are directly applied is constructed by the silicon nitride substrate having a high strength and a high toughness, it becomes possible to suppress cracking due to the fastening operation for fastening the circuit board in an assembly process, a crack formation under the heat cycled condition, and the like.

Further, in the above-described silicon nitride circuit board, metal circuit plates may be bonded to the high thermal conductive silicon nitride substrate and the cheap substrate through a metal bonding layer containing at least one active metal selected from Ti, Zr, Hf and Nb, the metal bonding layer being formed on the surface of the high thermal conductive silicon nitride substrate and the cheap substrate for general use which can be easily produced.

Further, a metal plate may also be bonded through a metal bonding layer formed on the surface of the above-described high thermal conductive silicon nitride substrate and the cheap substrate for general use which can be easily produced. The thickness of the metal circuit plate may advantageously be larger than that of the metal plate. Further, the metal plate may be bonded through a metal bonding layer to both the high thermal conductive silicon nitride substrate and the cheap substrate for general use so that the metal plate ranges to both substrate. Further, at least one metal circuit plate may advantageously be bonded through a metal bonding layer to both the high thermal conductive silicon nitride substrate and the cheap substrate for general use so that the metal circuit plates range to both substrates.

The high thermal conductive silicon nitride substrate to be used in the present invention may be constructed so as to contain a rare earth element in an amount of 1.0 to 17.5% by weight in terms of oxide thereof, and impurity cationic elements of Li, Na, K, Fe, Ca, Sr, Ba, Mn and B in a total amount of 1.0% by weight or less, preferably 0.3% by weight or less (including 0% by weight as a detection limit).

Here, as a matter of course, the above-described content range of 1.0 to 17.5% by weight of the rare earth oxide includes 1.0% by weight which is a lower limit of the content and 17.5% by weight which is an upper limit of the content. This is natural as mathematical expression, and also applied to the content ranges of other components.

In another aspect of this invention, the high thermal conductive silicon nitride substrate can be formed of a silicon nitride sintered body which contains a rare earth element in an amount of 1.0 to 17.5% by weight in terms of oxide thereof, and consists of silicon nitride crystal phase and grain boundary phase wherein a proportion of the crystalline compound phase in the grain boundary phase is 20% or more, preferably 50% or more based on the whole grain boundary phase.

It is particularly preferable to use a lanthanoid element as the above-described rare earth element for improving a thermal conductivity.

The high thermal conductive silicon nitride substrate used in the present invention may preferably contain at least one element selected from Ti, Zr, Hf, V, Nb, Ta, Cr, Mo and W in an amount of 0.1 to 3.0% by weight in terms of oxide thereof. This at least one element selected from Ti, Zr, Hf, V, Nb, Ta, Cr, Mo and W can be contained by being added to a silicon nitride powder as an oxide, carbide, nitride, silicide or boride.

The high thermal conductive silicon nitride substrate used in the present invention can be produced by a method in which a molded compact is prepared by molding a raw material mixture prepared by adding a rare earth element in an amount of 1.0 to 17.5% by weight in terms of oxide thereof to a silicon nitride powder having an average particle size of 1.0 $\mu$m or less which contains oxygen in an amount of 1.7% by weight or less, impurity cationic elements, Li, Na, K, Fe, Ca, Sr, Ba, Mn and B in a total amount of 1.0% by weight or less, preferably 0.3% by weight or less, and $\alpha$-phase type silicon nitride in an amount of 90% by weight or more, the resulted molded compact is degreased, then, is sintered under a pressured atmosphere of 1800 to 2100° C., and is gradually cooled at a cooling rate of 100° C./hour or less such that the sintering temperature decreases to a temperature at which a liquid phase formed from the above-described rare earth element in sintering is solidified.

According to the above-described production method, grain boundary phase containing a rare earth element and the like in silicon nitride crystal structure, and there can be obtained a silicon nitride substrate excellent in both mechanical property and thermal conductive property and having a porosity of 2.5% or less, a thermal conductivity of 60 w/m·k or more and a three point bending strength at room temperature of 650 MPa or more.

In the high thermal conductive silicon nitride substrate used in the present invention, the content of the above-described impurity cation elements can never become completely 0% by weight in mathematical sense. Therefore, the content of the impurity ion element prescribed in the present invention substantially includes 0% by weight as a detection limit irrespective of detection limit level.

Further, a silicon nitride substrate having a high density can be produced by using a silicon nitride raw material powder containing 90% by weight or more of $\alpha$-phase type silicon nitride excellent in sintering property as compared with β-phase type silicon nitride.

As the rare earth element to be added to the silicon nitride raw material powder as a sintering aid, oxides of Ho, Er, Yb, Y, La, Sc, Pr, Ce, Nd, Dy, Sm, Gd and the like or substances which are converted to these oxide by sintering operation may be contained alone or in combination of two or more. Particularly, holmium oxide ($Ho_2O_3$) and erbium oxide ($Er_2O_3$) are preferred.

Especially, by using lanthanoid series elements of Ho, Er or Yb as a rare earth element, sintering property is improved or high thermal conductivity is realized, and a sintered body which is fully densified can be obtained even in a low temperature range around 1850° C. Therefore, there can be also obtained effects of that apparatus cost and running cost of a sintering apparatus can be reduced. This sintering aid reacts with a silicon nitride raw material powder to form a liquid phase, and functions as a sintering accelerator.

The addition amount of the above-described sintering aid shall be in the range from 1.0 to 17.5 wt. % based on a raw material powder in terms of oxide thereof. When this addition amount is less than 1.0% by weight, compactness (densification) of the sintered body is insufficient, and particularly when a rare earth element is a high atomic number element such as lanthanoid series element, a sintered body having a relatively low strength and relatively low thermal conductivity is formed. On the other hand, when the addition amount is over 17.5% by weight, excess amount of grain boundary phase is disadvantageously formed, and thermal conductivity and strength begin to lower. Therefore, the above-described content range is prescribed. Particularly, because of the same reasons, the content range is desirably from 4 to 15% by weight.

The oxide, carbide, nitride, silicide or boride of Ti, Zr, Hf, V, Nb, Ta, Cr, Mo and W used as other selective additive component in the above-described production method promotes the function of the sintering accelerator of a rare earth element, and performs function for strengthening dispersion in the crystal structure, and improves a mechanical strength of the $Si_3N_4$ sintered body. In particular, compounds of Hf and Ti are preferable. When the addition amount of these compounds is less than 0.1% by weight, the addition effect is insufficient. On the other hand, when the amount is excess over 3.0% by weight, thermal conductivity, mechanical strength and electric breakdown strength are lowered. Therefore, the addition amount is shall be set to the range from 0.1 to 3.0% by weight. It is particularly desirable that the range shall be set to a range from 0.2 to 2% by weight.

Further, the compounds of Ti, Zr, Hf and the like also function as a shading agent or light shielding agent which colors a silicon nitride sintered body blackish to impart opacity. Therefore, when a circuit board on which an integrated circuit and the like which is liable to cause malfunction by a light is mounted is produced, it is desirable to appropriately add the above-described compounds such as Ti and the like and make a silicon nitride substrate excellent in shading property.

The sintered body is so produced that the porosity thereof is not more than 2.5% since it exerts an large influence on thermal conductivity and strength. When the porosity is over 2.5%, the thermal conductivity is disturbed, and the thermal conductivity of the sintered body is lowered, and the strength of the sintered body is also lowered.

Further, the silicon nitride sintered body is constituted from silicon nitride crystal phase and grain boundary phase, and a ratio or proportion of the crystalline compound phase in the grain boundary phase exerts an large influence on the thermal conductivity of the sintered body. Therefore, in the high thermal conductive silicon nitride substrate used in the present invention, it is necessary that the proportion of the crystalline compound phase is 20% or more, and more preferably, it is desirable that the proportion in the grain boundary phase is 50% or more.

Further, for obtaining the high thermal conductive silicon nitride substrate having a porosity of not more than 2.5% and a proportion of the crystal phase in the grain boundary phase formed in the silicon nitride crystal structure of 20% or more as described above, it is important to sinter a silicon nitride molded article under a pressured atmosphere for about 2 to 10 hours at 1800 to 2100° C., and to gradually cool the sintered body such that a cooling rate of the sintered body immediately after the sintering operation is completed is set to be 100° C./hour or less.

When the sintering temperature is less than 1800° C., compactness or density of the sintered body is insufficient, and the porosity becomes 2.5% by volume or more, and consequently the mechanical strength and the thermal conductivity of the sintered body are lowered together. On the other hand, when the sintering temperature is over 2100° C., the silicon nitride component itself tends to be vaporized and decomposed. In particular, when not pressured-sintering but ordinary pressure-sintering is conducted, decomposition and vaporization of the silicon nitride initiate from a temperature of around 1800° C.

The cooling rate of the sintered body immediately after the completion of the sintering operation is an important controlling factor for crystallizing the grain boundary phase, and when quick cooling in which the cooling rate is over 100° C. per hour is conducted, the grains boundary phase of the sintered body structure becomes non-crystalline (amorphous, glass phase), and the proportion of liquid phase formed as crystal phase in the sintered body becomes less than 20% in the grain boundary phase, and consequently, both strength and thermal conductivity are decreased.

It is sufficient that the above-described temperature range in which the cooling temperature should be strictly controlled is from a predetermined sintering temperature (1800 to 2100° C.) to a temperature at which liquid phase formed by the reaction of the sintering aid is solidified. The liquid phase solidifying temperature when the sintering aid as described above is used is approximately from 1600 to 1500° C. When the cooling rate of the sintered body from at least the sintering temperature to the above-described liquid phase solidifying temperature is controlled to be 100° C./hour or less, preferably 50° C./hour or less, and more preferably 25° C./hour or less, 20% or more, particularly preferably 50% or more of the grain boundary phase becomes a crystal phase. As a result, a sintered body excellent in both thermal conductivity and mechanical strength can be obtained.

The high thermal conductive silicon nitride substrate used in the present invention is produced, for example, through the following processes. Namely, a predetermined amount of a sintering aid, a necessary additive such as an organic binder and the like and optionally $Al_2O_3$, AlN, Ti compound and the like are added to a fine silicon nitride powder which has the above-described given fine particle size and contains a small amount of impurities thereby to prepare a raw material mixture. Then, the resulted raw material mixture is molded to obtain a molded body having a predetermined shape. As a method of molding the raw material mixture, a metal-mold (die) pressing method for general use, a sheet molding method such as a doctor blade method, and the like can be applied. Following the above-described molding operation, the molded body is preheated for 1 to 2 hours at 600 to 800° C. in a non-oxidizing atmosphere or at 400 to 500° C. in air, and the previously added organic binder component is fully removed and the molded body is degreased. Then, the degreased molded body is sintered under a pressured atmosphere of an inert gas such as a hydrogen gas and argon gas at a temperature of 1800 to 2100° C. for a predetermined period of time.

The silicon nitride substrate produced by the above-described production method has a porosity of 2.5% or less, a thermal conductivity of 60 w/m·k (at 25° C.) or more and a three point bending strength at ordinary temperature of 650 MPa or more, therefore the substrate is excellent also in mechanical properties.

The present invention does not include a silicon nitride substrate having a thermal conductivity of whole sintered body of 60 w/m·k or more obtained by adding high thermal conductive SiC and the like to a low thermal conductive silicon nitride. However, it is needless to say that the present invention includes a silicon nitride-based substrate obtained by combining a high thermal conductive SiC and the like with a silicon nitride sintered body having a thermal conductivity of 60 w/m·K or more.

The semiconductor module of the present invention is produced by integrally bonding a metal circuit plate and a metal plate having electric conductivity onto a front surface and a rear surface of the highly thermal conductive silicon nitride substrate produced as described above, respectively, using the above-described direct bonding method or the active metal brazing method.

In the semiconductor module of the present invention, since a high thermal conductive silicon nitride substrate having a sharply improved thermal conductivity in addition to a high strength and high toughness property originally owned by a silicon nitride sintered body is used as a ceramic substrate, cracking to be caused by the impacts applied in heat cycles and assembling operation of the modules seldom occurs on the substrate, and the module does not need both a rear copper plate (backing metal plate) and a heat sink plate for enhancing heat releasing property and structural strength. Therefore, the structure of the semiconductor module can be simplified and the production cost is steeply reduced, and further, the module can be miniaturized and high density mounting becomes possible.

Further, heat generated from a heat generating part such as a semiconductor element and the like mounted on the substrate is transmitted outside of the system quickly through the high thermal conductive silicon nitride substrate, therefore, heat releasing property of the module is extremely excellent. Further, since the silicon nitride substrate having a high strength and a high toughness is used, maximum deflecting of the module can be secured at a high level. Therefore, cracking due to fastening of the module in the assembly process does not occur, and a semiconductor apparatus using the semiconductor module can be cheaply produced in a large amount with a high production yield.

Since toughness of the high thermal conductive silicon nitride substrate is high, cracking seldom occurs on the connected portion between the substrate and the metal plate even if the heat cycles are applied, the heat cycle resistance property is remarkably improved, and a semiconductor apparatus excellent in durability and reliability can be provided.

Further, since the silicon nitride substrate having a high thermal conductivity is used, degradation in heat resistance property is small and excellent heat releasing property is demonstrated even if a semiconductor element directing to high output and high integration is mounted.

In particular, since the mechanical strength of the high thermal conductive silicon nitride substrate itself is excellent, when required mechanical strength properties are set to be constant, the thickness of the substrate can be reduced as compared with the case in which other ceramic substrate is used. Since the thickness of the substrate can be reduced as described above, the heat resistance can be more reduced, and the heat releasing property can be further improved. Further, since it is possible to cope with the required mechanical properties even with a substrate thinner than a conventional substrate, production cost of the substrate can be reduced.

Further, when only a conventional high thermal conductive aluminum nitride (AlN) substrate is used as a constituting material of a circuit board, it is necessary to increase the thickness of the aluminum nitride substrate for securing a certain degree of mechanical strength. However, in the semiconductor module and circuit board of the present invention, high heat releasing property is secured and high strength property is secured simultaneously mainly by a high thermal conductive silicon nitride substrate having a small thickness. Therefore whole module and whole circuit board can be formed in a small size.

On the other hand, the silicon nitride circuit board of the present invention is produced by integrally bonding a metal plate having electric conductivity to a portion between a plurality of the high thermal conductive silicon nitride substrates or to the front surface and/or optionally on the rear surface of the high thermal conductive silicon nitride substrates produced as described above by using the direct bonding method or the active metal brazing method.

Namely, in the silicon nitride circuit board of the present invention, a plurality of high thermal conductive silicon nitride substrates to which metal plates such as copper circuit plates and the like are bonded by using the direct bonding method or the active metal brazing method are plural-layered through the metal plate. Therefore, due to this possibility of three-dimensional assembly, the circuit board can be miniaturized with enlarging area of mounting portion and circuit constituting portions, and a small-sized arrangement and a high-density mounting can be accomplished.

Further, by preparing a plural-layered structure of the high thermal conductive silicon nitride substrates having a metal plate such as a copper plate, a package and the like can be produced. In addition, since a metal plate such as a copper plate is used as circuit constituting portions, current loss can be decreased as compared with a conventional plural-layered package, and the structure of the present invention can be applied to a high frequency type semiconductor element and a heavy current type semiconductor element.

In particular, since a high thermal conductive silicon nitride substrate having a sharply improved thermal conductivity in addition to a high strength and a high toughness property originally owned by a silicon nitride sintered body is used as a ceramic substrate, heat generated from a heat generating part such as a semiconductor element and the like mounted on the substrate is transmitted outside of the system quickly via the high thermal conductive silicon nitride substrate. Therefore, heat releasing property of the module becomes extremely excellent. Further, since the silicon nitride substrate having a high strength and a high toughness is used, a maximum deflecting amount of the module can be secured at a high level. Therefore, cracking due to fastening of the circuit board in the assembly process does not occur, and a semiconductor apparatus using the circuit board can be cheaply mass-produced in a large scale with a high production yield.

Further, in the silicon nitride circuit board of the present invention in which a silicon nitride substrate having a thermal conductivity of 60 w/m·k or more and a substrate having a thermal conductivity of less than 60 w/m·k are combined, the thickness of the high thermal conductive silicon nitride substrate can be variously changed according to required properties when used as a circuit substrate, and may be advantageously set to a predetermined value not more than 2-fold of the thickness of the circuit layer (circuit plate). When the thickness of the silicon nitride substrate is over 2-fold of the thickness of the circuit layer, the thickness of whole circuit board increases and the heat resistance increases. A concrete thickness of the silicon nitride substrate is in the range from 0.25 to 1.2 mm. Particularly, if the thickness of the silicon nitride substrate is set to a value not more than 0.8 mm, the thickness of whole circuit board can be reduced, a difference in heat resistance between the upper and lower surfaces of the circuit board can be more effectively reduced, and heat releasing property of whole the circuit board can be more improved.

On the other hand, the substrate having a thermal conductivity of less than 60 w/m·k used in the present invention is not particularly restricted. However, in view of low production cost, cheap substrates for general use such as an aluminum ($Al_2O_3$) substrate, resin substrate and the like can be particularly suitably used.

In the present invention, the two kinds of substrates i.e., the high thermal conductive silicon nitride substrate having a thermal conductivity of 60 w/m·k or more and the cheap substrate for general use having a thermal conductivity of less than 60 w/m·k are selectively used according to the required properties for the circuit board. Namely, a complex substrate is formed by placing the above-described high thermal conductive silicon nitride substrate on a part to which a structural strength and heat releasing property are required, and on the other hand, the cheap substrate for general use which can be easily produced is placed on other parts of the same plane.

The silicon nitride circuit board of the present invention is produced by bonding metal circuit plates having electric conductivity to the surface of the complex substrate produced as described above, and further, by mounting a semiconductor element through this metal circuit plate.

Further, it is preferable to integrally bond single metal plate to the rear surface, i.e., the surface opposing to the metal circuit plates-bonded surface of the complex substrate in which the high thermal conductive silicon nitride substrate and the cheap substrate for general use are combined on the same plane as described above. The metal plate is made of the same material as that of the metal circuit plates. By integrally bonding this metal plate, the circuit board is easily bonded to a heat releasing part such as a heat sink and the like. In addition, a deflection (warpage) and a deformation of the circuit board derived from a difference in heat expansion between the complex substrate and the metal circuit plates can be effectively prevented.

In particular, when the thickness of the metal circuit plates that are relatively sparsely formed is set to a value larger than that of the metal plate which is densely formed, amounts of the metals placed on both the front and rear surfaces of the complex substrate can be made equivalent, a difference in heat expansion between the front and rear surfaces of the complex substrate can be decreased. As a result, a deflection and deformation of the complex circuit board can be effectively prevented.

Further, when at least one metal circuit plate or at least one metal plate is integrally bonded to both the high thermal conductive silicon nitride substrate and the cheap substrate for general use, the silicon nitride substrate and the cheap substrate for general use placed on the same surface are bonded to each other, and integrity of the complex silicon nitride circuit board can be enhanced.

The bonding method of the metal circuit plates and the metal plate is not particularly restricted, and a direct bonding method and an active metal brazing method to be explained below can be applied.

The direct bonding method is a method in which an oxide layer having a thickness of about 0.5 to 10 $\mu$m is formed on the surface of a complex substrate comprising a silicon nitride substrate and a cheap substrate for general use, and metal circuit plates and metal plate which are used as a circuit layer are directly bonded to the above-described complex substrate through this oxide layer. The metal circuit plates and the metal plate are directly bonded to the surface of the complex substrate without using a bonding agent such as brazing material. Namely, an eutectic compound composed of a component of the metal circuit plates with a component of the substrate is generated by heating, and the both members are bonded to each other using this eutectic compound as a bonding agent.

This direct bonding method can be applied only to oxide type ceramic such as $Al_2O_3$ and the like, and if this method is applied to non-oxide type ceramic such as a silicon nitride substrate, aluminum nitride substrate and the like, a sufficient bonding strength of the metal circuit plate can not be obtained since wetting property against the substrate is low.

Therefore, in order to improve this wetting property against the substrate, it is necessary to previously form an oxide layer on the surface of the silicon nitride substrate or the aluminum nitride substrate. This oxide layer is formed by heating the above-described silicon nitride substrate or the aluminum nitride substrate at a temperature of 1000 to 1400° C. for 0.1 to 48 hours in an oxidizing atmosphere such as air and the like. When the thickness of this oxide layer is less than 0.5 $\mu$m, the above-described effect for improving the wetting property is weak, and even if the thickness is over 10 $\mu$m, the improving effect is saturated, and further, thermal conductivity tends to decrease. Therefore, the thickness of the oxide layer is set to a range from 0.5 to 10 $\mu$m, more preferably to a range from 1 to 5 $\mu$m.

The oxide layer of the $Si_3N_4$ substrate was originally made of only $SiO_2$ which is an oxidized material of the $Si_3N_4$ substrate component. However, an oxide of the rare earth element which had been added to the $Si_3N_4$ substrate as a sintering aid diffuses and migrates toward a direction for the oxide layer when the bonding operation of the metal circuit plate by heating is conducted. As a result, a structure in which the rare earth oxide is condensed in the oxide layer is formed. For example, when $Y_2O_3$ is used as the sintering aid, the oxide layer after the bonding operation by heating is constituted from a $SiO_2$—$Y_2O_3$ compound such as yttria silicate containing about 1 to 20% by weight of $Y_2O_3$. On the other hand, when an AlN substrate is used as a cheap substrate for general use, the oxide layer of the AlN substrate is constituted from $Al_2O_3$.

The metal constituting the metal circuit plates and metal plate is not particularly restricted as far as it forms an eutectic compound with a substrate component and the direct bonding method can be applied. The preferable examples of the metal may include copper, aluminum, iron, nickel, chromium, silver, molybdenum and cobalt, either alone or alloy thereof. However, in view of an electric conductivity and a raw material cost, copper and aluminum or alloy thereof are preferable.

The thickness of the metal circuit board (circuit layer) is determined in consideration of electric current capacity. When a silicon nitride substrate having a thickness of 0.25 to 1.2 mm and a metal circuit plate having a thickness of 0.1 to 0.5 mm are combined to be bonded each other, influences such as deformation due to the difference in heat expansion coefficients of the two members can be lowered.

When the metal circuit plate or the metal plate is a copper plate, the following bonding operation shall be carried out. Namely, a copper circuit plate is contacted and placed on a predetermined position of the surface of the silicon nitride substrate and the cheap substrate for general use on which the oxide layers are formed. The resulted composite is heated at a temperature lower than melting point of copper (1083° C.) and not lower than the eutectic temperature of copper-copper oxide (1065° C.) in condition that the plate is pressed toward the substrate direction. The copper circuit plates and the like are directly bonded to the silicon nitride substrate and the cheap substrate for general use using the generated Cu—O eutectic compound liquid phase as a bonding agent. This direct bonding method is, so-called, a copper direct bonding method (DBC: Direct Bonding Copper method). Further, by mounting a semiconductor chip (Si chip) by way of solder bonding on a predetermined position of the copper circuit plate directly bonded to the $Si_3N_4$ substrate, the silicon nitride circuit board of the present invention is produced. When an oxide type ceramic substrate such as $Al_2O_3$ substrate is used as the cheap substrate for general use, it is needless to say that the oxide layer as described above is not required to be formed.

On the other hand, when the metal circuit plate or the metal plate is an aluminum plate, an Al circuit plate is pressed on the $Si_3N_4$ substrate and the cheap substrate for general use. The resulted composite is heated at a temperature of eutectic temperature of aluminum-silicon or more in this pressed condition, and the Al circuit plates are directly bonded to the $Si_3N_4$ substrate using the generated Al—Si eutectic compound as a bonding agent. Further, by mounting a semiconductor chip by way of solder bonding on a predetermined position of the Al circuit plates directly bonded to the $Si_3N_4$ substrate, the silicon nitride circuit board of the present invention is produced.

Thus, according to the silicon nitride circuit board of the present invention formed by directly bonding metal circuit plates to the surface of a complex substrate using the direct bonding method, and further by mounting a plurality of semiconductor elements on the metal circuit plates bonded to a $Si_3N_4$ substrate, since no inclusion such as an adhesive and brazing agent exist between the metal circuit plates an the $Si_3N_4$ substrate or cheap substrate for general use, heat resistance between both substrates is small, and heat generated from the semiconductor element placed on the metal circuit plates can be quickly dissipated outside of the system.

The method for bonding the metal circuit plates and the like by the active metal method will be described below.

In the active metal method, a metal bonding layer (active metal brazing material layer) having a thickness about 20 $\mu$m is formed with an Ag—Cu—Ti-based brazing material having a suitable composition ratio which comprises at least one active metal selected from Ti, Zr, Hf and Nb. The metal bonding layer is formed on the surface of a complex substrate, and metal circuit plates such as a copper circuit plates and the like or a metal plate is bonded through this metal bonding layer. The active metal has effects to improve wetting property of a brazing material against the substrate and enhance bonding strength. As a concrete example of the active metal brazing material, a brazing material composition comprising 1 to 10 wt. % of the above-described active metal, 15 to 35 wt. % of Cu and substantially remaining parts of Ag is suitable. The above-described metal bonding layer is formed by a method in which a composition paste for bonding prepared by dispersing this brazing material composition in an organic solvent is screen-printed on the surface of the complex substrate and the like.

And, the metal circuit plates or the metal plate that are used as circuit layers are contacted and placed on the metal bonding layer screen-printed, and the resulted composite is heated at a temperature, for example, not less than Ag—Cu eutectic temperature (780° C.) and not more than melting point of the metal circuit plates (1083° C. in the case of copper), in vacuum or an inert gas atmosphere. In this contact condition, consequently, the metal circuit plates are bonded to the complex substrate through the metal bonding layer.

In the above-described circuit board, the metal circuit plates or the metal plate are integrally bonded to the complex substrate using the direct bonding method or the active metal method, thereby to form a circuit board. However, the circuit board can also be formed by using a metallizing method. Namely, in the metallizing method, a metallizing composition comprising as a main component, for example, a high melting point metal (refractory metal) such as molybdenum (Mo) and tungsten (W) and Ti or compound thereof is baked onto the surface of a complex substrate, to form a high melting point metal-metallized layer as the circuit layer having a thickness of about 15 $\mu$m.

When the circuit layer is formed by this metallizing method, it is preferable to form a metal plating layer having a thickness of 3 to 5 $\mu$m composed of Ni and Au on the surface of the metallized layer. By forming such a metal plating layer, the surface smoothness of the metallized layer is improved, and adhesion with a semiconductor element is further improved, and further, the solder wetting property can be improved. Therefore, a bonding strength of the semiconductor element bonded by using solder can be enhanced.

The silicon nitride circuit board having the above-described structure is formed by the following procedure. A high thermal conductive silicon nitride substrate particularly having a steeply improved thermal conductivity in addition to a high strength and a high toughness property originally owned by a silicon nitride sintered body is placed on a part to which a structural strength and a heat releasing property are particularly required, while a cheap substrate for general used which can be easily produced such as an alumina substrate and a resin substrate is plated on the other parts, the both substrates are placed on the same plane to form a complex substrate, a metal circuit plate is integrally bonded to the surface of this complex substrate, and further, a semiconductor element is mounted on the metal circuit plates bonded to the high thermal conductive silicon nitride substrate.

Therefore, the production cost is low, and further, a heat generated from a heat-generating part such as the semiconductor element and the like is quickly transmitted outside of the system through the high thermal conductive silicon nitride substrate. Therefore, the heat releasing property of the module is extremely excellent. Further, when the high thermal conductive silicon nitride substrate having a high strength and a high toughness is placed on a site where the structural strength is particularly required, a maximum deflecting of the circuit board can be secured at a high level. Therefore, cracking due to the fastening of the circuit board in the assembly process does not occur, and a semiconductor apparatus using the circuit board can be mass-produced with a low cost and a high production yield.

Since toughness of the silicon nitride substrate is high, cracking seldom occurs at the connecting portions between the substrate and the metal plate even if the heat cycles are applied, the heat cycle resistance property is remarkably improved, and a semiconductor apparatus excellent in durability and reliability can be provided. Further, since the silicon nitride substrate having a high thermal conductivity is used, degradation in heat resistance property is small and an excellent heat releasing property is demonstrated even if a semiconductor element directing to a high output use or a high-integrated use is mounted.

In particular, since a mechanical strength of the silicon nitride substrate itself is excellent, when required mechanical strength properties are assumed to be constant, the thickness of the substrate can be reduced as compared with the case in which other ceramic substrate is used. Since the thickness of the substrate can be reduced as described above, the heat resistance can be further reduced, and the heat releasing property can be also further improved. Further, since it becomes possible to cope with the required mechanical properties even with a substrate thinner than a conventional substrate, production cost of the substrate can be reduced. Further, when only a conventional high thermal conductive aluminum nitride (AlN) substrate is used as a constituting material of a circuit board, it is necessary to increase the thickness of the aluminum nitride substrate for securing a certain degree of mechanical strength. However, in the circuit board of the present invention, a high heat releasing property is secured and a high strength property is secured simultaneously mainly by the high thermal conductive silicon nitride substrate. In addition, since it is possible to form the cheap substrate for general use which can be easily produced such as an alumina substrate or resin substrate so that the thickness thereof is as small as equivalent to the thickness of the silicon nitride substrate in particular, the heat resistance of the cheap substrate for general use can be further synergistically reduced. Therefore, according to the present invention, the heat releasing property can be further enhanced as compared with the conventional circuit board using only the conventional cheap substrate for general use having the equivalent thermal conductivity.

BEST MODE FOR CARRYING OUT THE INVENTION

Figure 1:
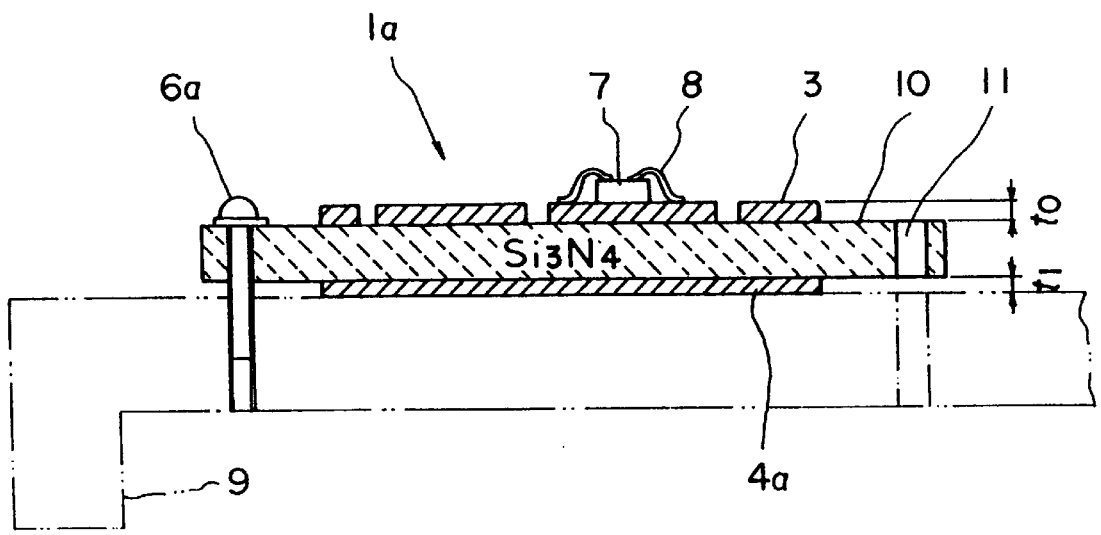
FIG. 1 is a cross-sectional view showing a structure of a semiconductor module according to one embodiment of the present invention.

The practical embodiments of the present invention are specifically illustrated referring to examples and appended drawings as shown below. First, the high thermal conductive silicon nitride substrate used in the present invention will be described, and then, a semiconductor module and a silicon nitride circuit board using this high thermal conductive silicon nitride substrate as a ceramic substrate will be explained.

Various high thermal conductive silicon nitride substrates which are used as a constitutional material for the semiconductor module and the silicon nitride circuit board of the present invention were produced according to the following procedure.

Namely, as shown in Tables 1 to 3, rare earth oxides such as $Y_2O_3$, $Ho_2O_3$ and the like as a sintering aid and optionally Ti, Hf compound, $Al_2O_3$ powder, AlN powder are added to silicon nitride raw material powders having an average particle size of 0.55 μm containing oxygen in an amount of 1.3% by weight, the above-described impurity cation elements in a total amount of 0.15% by weight and an α-phase type silicon nitride in an amount of 97%, thereby to prepare various raw material mixtures. The mixtures were subjected to a wet mixing in ethyl alcohol for 72 hours using silicon nitride balls, then dried to prepare raw material powder mixtures respectively. Then, an organic binder in given amount was added to respective raw material powder mixtures, and uniformly mixed. Then, the powder mixtures were press-molded under a molding pressure of 1000 kg/cm², to produce a lot of molded bodies having various compositions.

Then, the resulted respective molded bodies were degreased in a gas atmosphere at 700° C. for 2 hours. Thereafter, these degreased bodies were subjected to compacting sintering under sintering conditions shown in Tables 1 to 3. The cooling rates of sintered bodies until the inner temperature of the sintering furnace lowered to 1500° C. were regulated to reach values respectively shown in Tables 1 to 3 by controlling electric current to a heating apparatus equipped to the sintering furnace, thereby to cool the sintered bodies. Consequently, silicon nitride sintered bodies corresponding to samples 1 to 51 respectively were prepared. Further, the resulted sintered bodies were cut into high thermal conductive silicon nitride substrates having a predetermined rectangular shape of which thickness was 0.3 mm, 0.5 mm or 0.6 mm.

Average values of porosity, thermal conductivity (at 25° C.) and three point bending strength at room temperature of thus obtained respective silicon nitride substrates corresponding to samples 1 to 51 were measured. Further, regarding respective silicon nitride substrates, proportion (ratio) of crystal phase occupying grain boundary phase was measured by an X-ray diffraction method, and results shown in Tables 1 to 3 were obtained.

TABLE 1

| SAMPLE | SOURCE COMPOSITION (WEIGHT %) | | SINTERING CONDITION TEMPERATURE x TIME (τ) × (hr) | COOLING RATE TO 1500 τ AFTER SINTERING (τ/hr) | POROSITY (%) | RATIO OF CRYSTAL PHASE TO GRAIN BOUNDARY PHASE (%) | THERMAL CONDUCTIVITY (W/m.K) | THREE-POINT BENDING STRENGTH (MPa) |
|---|---|---|---|---|---|---|---|---|
| | $Si_3N_4$ | $Ho_2O_3$ | | | | | | |
| 1 | 92 | 8 | 1950 × 6 | 100 | 0.2 | 22 | 89 | 845 |
| 2 | 92 | 8 | 1950 × 6 | 50 | 0.1 | 28 | 92 | 820 |
| 3 | 92 | 8 | 1900 × 6 | 50 | 0.6 | 34 | 95 | 800 |
| 4 | 90 | 10 | 1950 × 6 | 100 | 0.5. | 25 | 95 | 820 |
| 5 | 90 | 10 | 1950 × 6 | 25 | 0.3 | 65 | 99 | 705 |
| 6 | 90 | 10 | 1900 × 6 | 25 | 0.9 | 67 | 104 | 805 |
| 7 | 87.5 | 12.5 | 1975 × 6 | 50 | 0.4 | 69 | 114 | 760 |
| 8 | 87.5 | 12.5 | 1900 × 6 | 25 | 1.2 | 70 | 105 | 795 |
| 9 | 85 | 15 | 1950 × 6 | 100 | 1.2 | 40 | 102 | 780 |
| 10 | 85 | 15 | 2000 × 6 | 100 | 0.6 | 35 | 108 | 700 |
| 11 | 85 | 15 | 1950 × 6 | 25 | 1.0 | 65 | 120 | 730 |
| 12 | 82.5 | 17.5 | 1950 × 6 | 100 | 2.3 | 30 | 90 | 755 |
| 13 | 82.5 | 17.5 | 2000 × 6 | 100 | 1.8 | 28 | 96 | 700 |
| 14 | 82.5 | 17.5 | 2000 × 6 | 25 | 1.4 | 32 | 100 | 680 |

TABLE 2

| SAMPLE | SOURCE COMPOSITION (WEIGHT %) | | | | | SINTERING CONDITION TEMPERATURE x TIME (τ) × (hr) | COOLING RATE TO 1500 τ AFTER SINTERING (τ/hr) | POROSITY (%) | RATIO OF CRYSTAL PHASE TO GRAIN BOUNDARY PHASE (%) | THERMAL CONDUCTIVITY (w/m.K) | THREE-POINT BENDING STRENGTH (MPa) |
|---|---|---|---|---|---|---|---|---|---|---|---|
| | $Si_3N_4$ | $Y_2O_3$ | OTHER COMPONENT | | $Al_2O_3$ | AlN | | | | | | |
| 15 | 94.8 | 5 | $HfO_2$ | 0.2 | | | 1900 × 6 | 50 | 1.3 | 50 | 88 | 840 |
| 16 | 94 | 5 | $HfO_2$ | 1 | | | 1900 × 6 | 50 | 0.2 | 55 | 90 | 960 |
| 17 | 92 | 5 | $HfO_2$ | 3 | | | 1900 × 6 | 50 | 0.1 | 45 | 75 | 1060 |
| 18 | 95 | 2 | $HfO_2$ | 3 | | | 1900 × 6 | 50 | 0.5 | 30 | 65 | 930 |
| 19 | 92 | 7.5 | $HfO_2$ | 0.5 | | | 1900 × 6 | 50 | 0.1 | 75 | 95 | 870 |
| 20 | 94 | 5 | $HfO_2$ | 1 | | | 1900 × 6 | 100 | 0.2 | 45 | 80 | 980 |
| 21 | 94 | 5 | HfC | 1 | | | 1900 × 6 | 100 | 0.3 | 55 | 92 | 960 |
| 22 | 94 | 5 | HfN | 1 | | | 1950 × 6 | 100 | 0.4 | 55 | 90 | 930 |
| 23 | 94 | 5 | $HfSi_2$ | 1 | | | 1950 × 6 | 100 | 0.4 | 50 | 88 | 910 |
| 24 | 94 | 5 | $HfB_2$ | 1 | | | 1900 × 6 | 100 | 0.4 | 45 | 83 | 880 |
| 25 | 94 | 5 | $TiO_2$ | 1 | | | 1900 × 6 | 100 | 0.2 | 48 | 80 | 960 |
| 26 | 94 | 5 | $ZrO_2$ | 1 | | | 1900 × 6 | 100 | 0.2 | 45 | 85 | 1030 |
| 27 | 94 | 5 | $V_2O_5$ | 1 | | | 1900 × 6 | 100 | 0.3 | 50 | 90 | 930 |
| 28 | 94 | 5 | $Nb_2O_5$ | 1 | | | 1900 × 6 | 100 | 0.2 | 48 | 83 | 880 |
| 29 | 94 | 5 | $Ta_2O_5$ | 1 | | | 1900 × 6 | 100 | 0.4 | 45 | 80 | 900 |
| 30 | 94 | 5 | $Cr_2O_3$ | 1 | | | 1900 × 6 | 100 | 0.2 | 58 | 100 | 930 |
| 31 | 94 | 5 | $MoO_3$ | 1 | | | 1900 × 6 | 100 | 0.4 | 40 | 75 | 910 |
| 32 | 94 | 5 | $WO_3$ | 1 | | | 1900 × 6 | 100 | 0.3 | 40 | 75 | 880 |
| 33 | 94 | 5 | TiC | 1 | | | 1900 × 6 | 100 | 0.4 | 59 | 95 | 930 |
| 34 | 94 | 5 | WC | 1 | | | 1900 × 6 | 100 | 0.3 | 49 | 83 | 910 |
| 35 | 94 | 5 | $TiB_2$ | 1 | | | 1900 × 6 | 100 | 0.4 | 40 | 80 | 950 |
| 36 | 94 | 5 | HfO2 $TiO_2$ | 0.5 0.5 | | | 1900 × 6 | 100 | 0.2 | 46 | 82 | 1000 |

TABLE 3

| SAMPLE | Si₃N₄ | SOURCE COMPOSITION (WEIGHT %) RARE EARTH OXIDE | | OTHER COMPONENT | | Al₂O₃ | AlN | SINTERING CONDITION TEMPERATURE x TIME (τ) × (hr) | COOLING RATE TO 1500 τ AFTER SINTERING (τ.hr) | POROSITY (%) | RATIO OF CRYSTAL PHASE TO GRAIN BOUNDARY PHASE (%) | THERMAL CONDUCTIVITY (W/m.K) | THREE-POINT BENDING STRENGTH (MPa) |
|---|---|---|---|---|---|---|---|---|---|---|---|---|---|
| 37 | 88 | Ho₂O₃ Y₂O₃ | 6.5 3.5 | HfO₂ | 2 | | | 1900 × 6 | 50 | 0.2 | 55 | 120 | 720 |
| 38 | 88 | Er₂O₃ Y₂O₃ | 6.5 3.5 | HfO₂ | 2 | | | 1900 × 6 | 50 | 0.1 | 54 | 119 | 775 |
| 39 | 88 | Yb₂O₃ Y₂O₃ | 6.5 3.5 | HfO₂ | 2 | | | 1900 × 6 | 50 | 0.2 | 60 | 1225 | 750 |
| 40 | 83.9 | Ho₂O₃ | 15 | HfO₂ | 1 | 0.1 | | 1900 × 6 | 50 | 0.1 | 49 | 106 | 770 |
| 41 | 84 | Ho₂O₃ | 15 | HfO₂ | 0.5 | 0.5 | | 1900 × 6 | 50 | 0.1 | 30 | 90 | 850 |
| 42 | 82 | Ho₂O₃ | 15 | HfO₂ | 2 | 1 | | 1850 × 6 | 25 | 0.1 | 22 | 82 | 900 |
| 43 | 82.5 | Ho₂O₃ | 15 | HfO₂ | 2 | | 0.5 | 1900 × 6 | 50 | 0.1 | 39 | 100 | 880 |
| 44 | 83 | Ho₂O₃ | 15 | HfO₂ | 2 | | 1 | 1900 × 6 | 50 | 0.1 | 24 | 88 | 870 |
| 45 | 82.6 | Ho₂O₃ | 15 | HfO₂ | 2 | 0.2 | 0.2 | 1900 × 6 | 50 | 0.1 | 37 | 100 | 885 |
| 46 | 82.5 | Er₂O₃ | 15 | HfO₂ | 2 | 0.5 | | 1900 × 6 | 50 | 0.1 | 40 | 94 | 850 |
| 47 | 82.5 | Er₂O₃ | 15 | HfO₂ | 2 | | 0.5 | 1900 × 6 | 50 | 0.1 | 38 | 93 | 825 |
| 48 | 89.8 | Y₂O₃ | 8 | HfO₂ | 2 | 0.2 | | 1900 × 6 | 50 | 0.1 | 36 | 95 | 800 |
| 49 | 84 | Ho₂O₃ | 15 | TiO₂ | 0.5 | 0.5 | | 1900 × 6 | 50 | 0.1 | 28 | 88 | 820 |
| 50 | 84 | Er₂O₃ | 15 | TiO₂ | 0.5 | 0.5 | | 1900 × 6 | 50 | 0.1 | 27 | 88 | 810 |
| 51 | 84 | Yb₂O₃ | 12.5 | TiO₂ | 0.5. | 0.5 | | 1900 × 6 | 50 | 0.1 | 27 | 90 | 700 |

As is apparent from the results shown in Tables 1 to 3, in the silicon nitride sintered bodies of the samples 1 to 51, since the raw material composition and impurity amount were suitably controlled, and the cooling rates of the sintered bodies directly after completion of the compacting sintering were lowered as compared with the conventional example, there could be obtained high strength silicon nitride substrates containing a crystal phase in a grain boundary phase and having a high thermal conductivity and a higher heat releasing property as the proportion (ratio) of the crystal phase occupying the grain boundary phase is increased.

On the other hand, 3 to 6% by weight of a $Y_2O_3$ (yttrium oxide) powder and 1.3 to 1.6% by weight of an alumina powder were added to a silicon nitride raw material powder having an average particle size of 0.60 μm containing oxygen in an amount of 1.3 to 1.5% by weight, the above-described impurity cation elements in a total amount of 0.13 to 1.50% by weight and an α-phase type silicon nitride in an amount of 93%, the resulted raw material powder mixture was molded, degreased, then, sintered at 1900° C. for 6 hours, and sintered, then, a furnace cooling which is industrially conducted in general (cooling rate: 400° C./hr) was conducted. The resulted sintered bodies had a thermal conductivity of as low as 25 to 28 w/m·k which is near thermal conductivity of a silicon nitride sintered body produced according to a conventional general method.

With respect to thus obtained high thermal conductive silicon nitride substrates having a thickness of 0.5 mm corresponding to the resulted samples 1 to 51, a metal circuit plates and a metal plate are integrally bonded to both surfaces of the substrate using the direct bonding method or the active metal method, whereby semiconductor modules were respectively produced.

FIG. 1 is a cross-sectional view showing a structure of a semiconductor module 1a according to one embodiment of the present invention.

In FIG. 1, copper plates 3 as the metal circuit plates are integrally bonded to the front surface of the high thermal conductive silicon nitride substrate 10, and a copper plate 4a as the backing metal plate is bonded to the rear surface of the high thermal conductive silicon nitride substrate 10. Thus the semiconductor module 1a is constituted.

The copper plates 3, 4a in the semiconductor module 1a are bonded to the high thermal conductive silicon nitride substrate 10 by using the direct bonding method, so-called DBC method. For the copper plates 3, 4a when such a DBC method is used, it is preferable to use copper such as tough pitch copper containing oxygen in a proportion of 100 to 3000 ppm. However, it is also possible to use oxygen-free copper of which surface is oxidized. Instead of a simple plate of copper and copper alloy, there can be also used a clad plate formed by copper material with other metal member, and at least a surface portion of the clad plate to be contacted to the high thermal conductive silicon nitride substrate 10 is constituted by the copper material.

The copper plate 3 bonded to the front surface of the high thermal conductive silicon nitride substrate 10 is a member which becomes a mounting site for mounting a semiconductor part and the like, and patterned into a predetermined circuit form. A semiconductor element 7 is solder-bonded to a predetermined site of the copper plates 3, an electrode portion of the semiconductor element 7 and an electrode portion of the copper plates 3 are electrically connected by a bonding wire 8. The copper plate (backing copper plate) 4a bonded to the rear surface of the high thermal conductive silicon nitride substrate 10 is a member for preventing a bending and the like of the high thermal conductive silicon nitride substrate 10 at the bonding operation. The copper plate is bonded and formed to approximately whole rear surface of the high thermal conductive silicon nitride substrate 10 in condition that is separated around the center into two parts. As shown in FIG. 1, a thickness t1 of the copper plate 4a bonded to the rear surface may be the same as that of the copper plate 3 i.e., metal circuit plates which become the mounting site of a semiconductor part and the like. However, it is preferable to use a copper plate having a thickness not more than the thickness t0 of the copper plates 3, further preferably a thickness corresponding to 70 to 90% of the thickness t0 of the copper plates 3.

Figure 3:
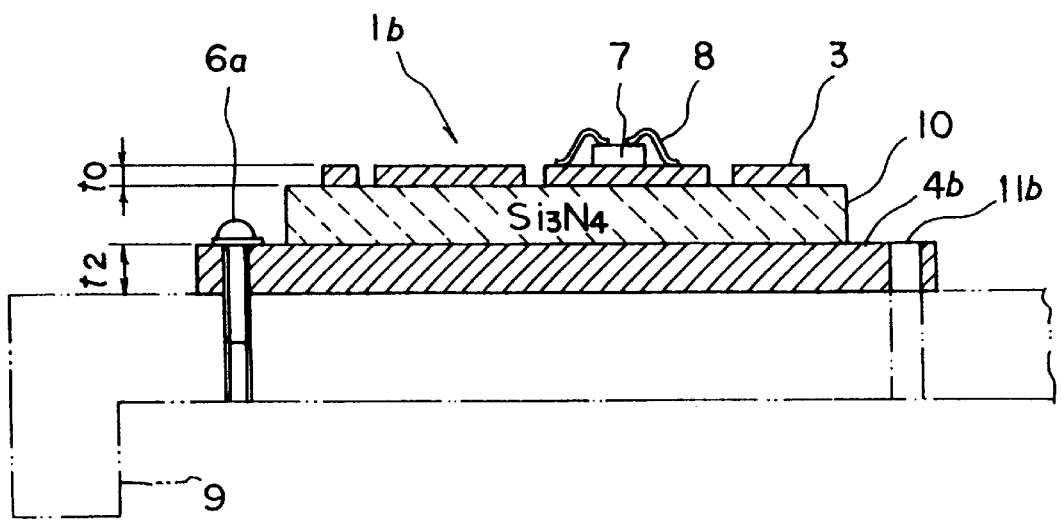
FIG. 3 is a cross-sectional view of a semiconductor module according to another embodiment of the present invention.
Figure 4:
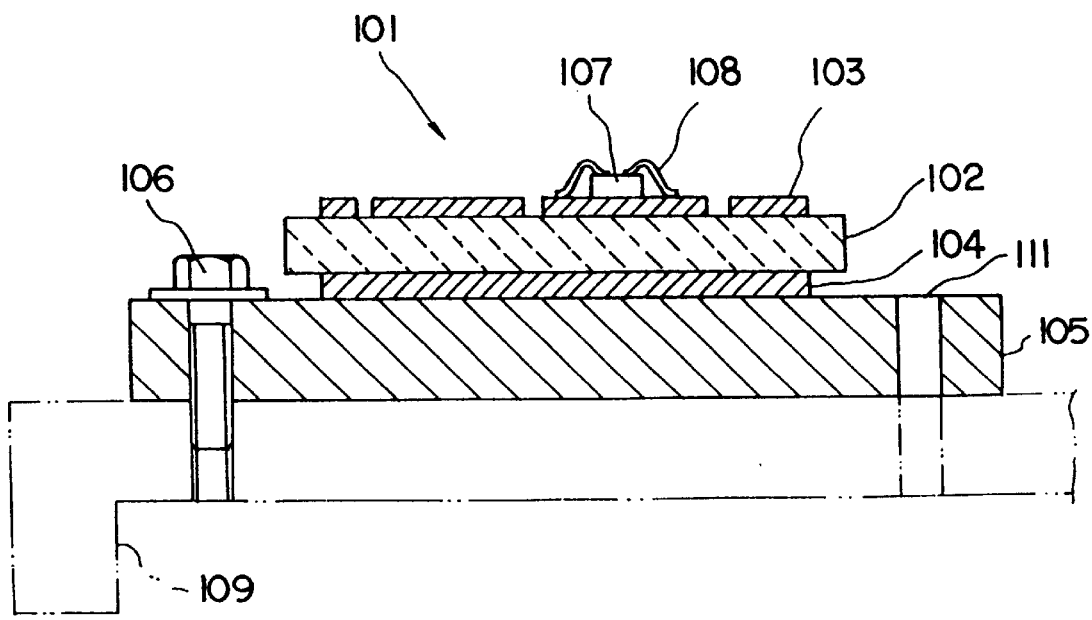
FIG. 4 is a cross-sectional view showing a structure of a conventional semiconductor module.

On the other hand, as shown in FIG. 3, when a function as a heat sink plate for improving the heat releasing property is imparted to the metal plate 4b to be bonded to the rear surface of the high thermal conductive silicon nitride substrate 10, it is preferable that the thickness t2 of the metal plate 4b to be bonded to an apparatus casing 9 or a mounting board is 2-fold or more of the thickness t0 of the metal circuit plates.

By the structure that the thickness t2 of the metal plate 4b bonded to the rear surface of the high thermal conductive silicon nitride substrate 10 is 2-fold or more of the thickness t0 of the metal circuit plates 3, the effect that this metal plate 4b functions as a heat sink can be increased even if a heat sink plate is not used. Therefore, the heat releasing property of the module can be further improved.

In this embodiment, the semiconductor module 1a shown in FIG. 1 is obtained by bonding the copper plates 3, 4a to the high thermal conductive silicon nitride substrate 10 by the DBC method. However, it may be a semiconductor module obtained by bonding the copper plates 3, 4a to the high thermal conductive silicon nitride substrate 10 by the active metal method. The above-described active metal method is a method in which the copper plates 3, 4a are bonded to the high thermal conductive silicon nitride substrate 10 through a brazing material (hereinafter, referred to as active metal-containing brazing material) layer containing at least one active metal selected from, for example, Ti, Zr, Hf, Nb and the like. As a composition of the active metal-containing brazing material to be used, a composition obtained by adding 1 to 10% by weight of at least one active metal selected from Ti, Zr, Hf, Nb and the like to an Ag—Cu-based brazing material or Cu-based brazing material as a main component having, for example, an Ag—Cu eutectic composition (72% by weight of Ag—28% by weight of Cu) or the near composition, and the like are exemplified. Further, it is also possible to add 1 to 10% by weight of In to the active metal-containing brazing material.

As like the semiconductor module 1a shown in FIG. 1, the module obtained by bonding the copper plates 3, 4a to the high thermal conductive silicon nitride substrate 10 by the DBC method has merits that the structure is simple, a high bonding strength is obtained, the production process can be simplified, and the like. On the other hand, in the module obtained by bonding the copper plates 3, 4a to the high thermal conductive silicon nitride substrate 10 by the active metal method, a high bonding strength is obtained, and further, the active metal-containing brazing material layer also functions as a stress modulating layer. Therefore, the reliability of the module can be improved. Because of these reasons, it is preferable to select the bonding method in accordance with the required properties or uses and the like.

Further, when the metal circuit plates and the metal plate are bonded to the high thermal conductive silicon nitride substrate 10 by the active metal method, it is also possible to use various metal plates according to use, for example, a nickel plate, a tungsten plate, a molybdenum plate, an alloy plate thereof, a clad plate (including a clad plate with the copper plate) and the like, without limiting to the copper plate.

The semiconductor module 1a as described above can be produced, for example, by the following procedure. Namely, for example, an oxygen-containing copper plate such as tough pitch copper is processed into a predetermined form (regarding the copper plate 3, it has a circuit pattern form). The resulted copper plates 3, 4a are respectively contacted and placed on the surface of the high thermal conductive silicon nitride substrate 10, and by heating at a temperature of not higher than a melting point (1356 K) of copper and not lower than an eutectic temperature of copper with copper oxide (1338 K), whereby the respective copper plates 3, 4a are bonded. Further, a semiconductor element 7 is solder-bonded to a predetermined position of the copper plate 3, and an electrode of the semiconductor element 7 and an electrode of the copper plate 3 are connected by a bonding wire 8 to produce a semiconductor module. It is preferable that the atmosphere in bonding operation with heating of this copper plate is an inert gas atmosphere when an oxygen-containing copper plate is used as the copper plate.

Further, the semiconductor module obtained by bonding the metal circuit plates and metal plate by the active metal method can be produced, for example, by the following procedure. First, as like the above-described semiconductor module 1a, the copper plates 3, 4a each having a predetermined shape are prepared. On the other hand, a paste prepared from the active metal-containing brazing material as described above is applied, for example, to the surface of the high thermal conductive silicon nitride substrate 10. Regarding the application thickness of the brazing material layer, it is preferable that the thickness of the brazing material layer after the bonding with heating is not so large, in view of improvement of cooling and heating cycle property. Then, the copper plates 3, 4a are respectively laminated and placed on the surface of the high thermal conductive silicon nitride substrate 10, and by conducting heat treatment at a temperature corresponding to a brazing material used, whereby the metal circuit plate 3 and the metal plate 4a are bonded. Further, the semiconductor element 7 is solder-bonded to a predetermined position on the copper plate 3, and an electrode of semiconductor element 7 and an electrode of the copper plate 3 are connected by a bonding wire 8 thereby to produce a semiconductor module.

Figure 2:
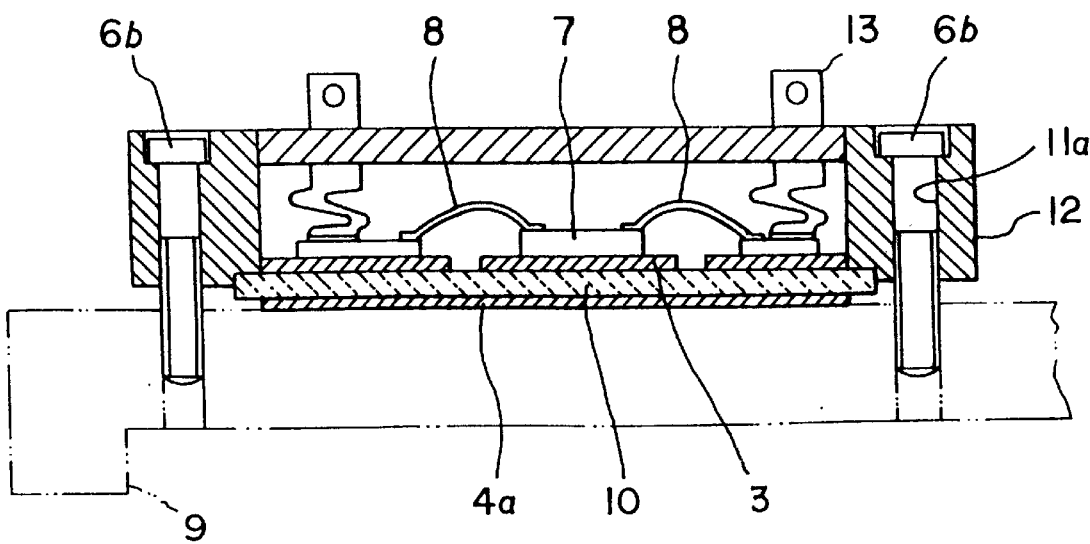
FIG. 2 is a cross-sectional view of a semiconductor module according to another embodiment of the present invention.

The semiconductor module 1a shown in FIG. 1 is fastened and fixed to the apparatus casing 9 by inserting an attaching screw 6a into a penetration bore for attaching a screw 11 formed on a periphery part of the silicon nitride substrate 10. However, since a silicon nitride sintered body has a high hardness, and therefore, a perforating process is not easy. Therefore, to simplify the production process, for example, as shown in FIG. 2, a case 12 in a form of a frame to which a penetration bore for attaching screw 11a is formed is prepared, and an inner peripheral edge portion of this case 12 is pressed onto an outer periphery edge portion of the semiconductor module, whereby the module can be also fixed by being pressed to a device casing 9 by means of an attaching screw 6b.

In the semiconductor module having the above-described structure, since the high thermal conductive silicon nitride substrate 10 having a sharply improved thermal conductivity in addition to a high strength and a high toughness property originally owned by the silicon nitride sintered body is used as a ceramic substrate, cracking seldom occurs on the substrate 10 by impacts caused in heat cycles and assembling process. In particular, the module does not need any heat sink plate for enhancing the heat releasing property and the structural strength. Therefore, the structure of the semiconductor module is simplified and the production cost is steeply reduced. Further, the module can be miniaturized and a high density mounting becomes possible. Consequently, a down-sizing of the semiconductor apparatus can be effectively accomplished.

Specific examples and evaluation results are described below.

EXAMPLE 1

As a high thermal conductive silicon nitride substrate, high thermal conductive silicon nitride substrates 10 having a thickness of 0.5 mm which carries on the surface an oxide layer ($SiO_2$ layer) having a thickness of 4 μm were prepared by adopting silicon nitride substrates corresponding to the samples 1 to 51 shown in Tables 1–3 and by oxidizing them. Further, copper plates 4a as a metal plate having a thickness of 0.25 mm and metal plates 3 as metal circuit plates each having a thickness of 0.3 mm in a predetermined form made of tough pitch copper (oxygen content: 300 ppm) were prepared by pressing process.

Then, as shown in FIG. 1, two copper plates 3, 4a were directly contacted and placed on both surfaces of the high thermal conductive silicon nitride substrate 10 to form a composite. The composite was heated for bonding at 1348 K in nitrogen gas atmosphere, and further, the semiconductor element 7 was solder-bonded to the copper plate 3, and wire bonding was performed thereby to obtain an intended semiconductor module 1a.

On the other hand, as a comparative example, a semiconductor module of the comparative example was produced in the same manner as in Example 1 except that an aluminum nitride substrate having a thickness of 0.6 mm was used instead of the above-described high thermal conductive silicon nitride substrate 10.

Thus obtained semiconductor modula 1a of Example 1 and semiconductor module of comparative example were subjected to a heat cycle test (TCT: 233 K×30 minutes+RT× 10 minutes+398 K×30 minutes is set to one cycle), and ratios of cracking formation occurred on the ceramic substrates were measured. As a result, in the semiconductor module of Example 1, no cracking occurred even after 100 cycles of TCT. On the other hand, in the semiconductor module of comparative example, the cracking occurred on 5 to 9% of the ceramic substrates after 100 cycles of TCT.

EXAMPLE 2

As a high thermal conductive silicon nitride substrate, highly thermal conductive silicon nitride substrates 10 having a thickness of 0.5 mm corresponding to the samples 1 to 51 were prepared. Further, copper plates 3, 4 having a thickness of 0.3 mm and copper plates 5 having a thickness of 0.25 mm respectively having a predetermined form were prepared by a pressing process.

A paste prepared from an active metal-containing brazing material having a composition of In:Ag:Cu:Ti= 14.0:59.0:23.0:4.0 was applied on both surfaces of the high thermal conductive silicon nitride substrate 10. Then, the copper plates 3, 4a were laminated and placed through this applied layer to form a composite. Then, the composite was heated for integration in a nitrogen gas atmosphere. Further, the semiconductor element 7 was solder-bonded to the copper plate 3, and wire bonding was effected to obtain an intended semiconductor module.

Thus obtained semiconductor module was subjected to the heat cycle test (TCT) under the same condition as in Example 1. As a result, excellent results as in Example 1 were obtained, and an excellent reliability of the module against the cooling and heating cycles was confirmed.

EXAMPLE 3

As a high thermal conductive silicon nitride substrate, high thermal conductive silicon nitride substrates 10 having a thickness of 0.5 mm which carries on the surface an oxide layer ($SiO_2$ layer) having a thickness of 4 μm were prepared by adopting silicon nitride substrates corresponding to the above-described samples 1 to 51 and by oxidizing them. Further, copper plates 3 having a thickness of 0.3 mm and metal plates 4 having a thickness of 0.6 mm in a predetermined form made of tough pitch copper (oxygen content: 300 ppm) were prepared by pressing process.

Then, as shown in FIG. 3, two copper plates 3, 4a were directly contacted and placed on both surfaces of the high thermal conductive silicon nitride substrate 10 to form a composite. The composite was then heated for bonding at 1348 K in a nitrogen gas atmosphere. Further, the semiconductor element 7 was solder-bonded to the copper plate 3, and wire bonding was performed to obtain an intended semiconductor module.

On the other hand, as a comparative example, a semiconductor module of the comparative example was produced in the same manner as in Example 3 except that aluminum nitride substrates 2a, 2b each having a thickness of 0.6 mm were used instead of the above-described high thermal conductive silicon nitride substrate 10.

Thus obtained semiconductor module of Example 3 and the semiconductor module of comparative example were subjected to heat cycle test (TCT: 233 K×30 minutes+RT× 10 minutes+398 K×30 minutes is set to one cycle), and ratios of the cracking formation occurred on the ceramic substrates were measured. As a result, in the semiconductor module 1b of Example 3, no cracking occurred even after 100 cycles of TCT. On the other hand, in the semiconductor module of comparative example, the cracking occurred on 4 to 7% of the ceramic substrates after 100 cycles of TCT.

EXAMPLE 4

As a high thermal conductive silicon nitride substrate, high thermal conductive silicon nitride substrates 10 having a thickness of 0.5 mm corresponding to the samples 1 to 51 were prepared. Further, copper plates 3 having a thickness of 0.3 mm and copper plates 4b having a thickness of 0.6 mm respectively having predetermined forms were prepared by pressing process.

A paste prepared from an active metal-containing brazing material having a composition of In:Ag:Cu:Ti= 14.0:59.0:23.0:4.0 was applied to both surfaces of the high thermal conductive silicon nitride substrate 10. The copper plates 3, 4b were laminated and placed through this applied layer to form a composite. Then, the composite was heated for integration in a nitrogen gas atmosphere, and further, the semiconductor element 7 was solder-bonded to the copper plate 3, and wire bonding was effected to obtain an intended semiconductor module.

Thus obtained semiconductor module was subjected to the heat cycle test under the same condition as in Example 3. As a result, excellent results as in Example 3 were obtained, and an excellent reliability of the module against cooling and heating cycles was confirmed.

Further, according to the semiconductor module of the present invention, since the high thermal conductive silicon nitride substrate 10 having a sharply improved thermal conductivity in addition to a high strength and a high toughness property originally owned by a silicon nitride sintered body is used. Therefore, the module does not need both a rear copper plate (backing metal plate) and a heat sink plate for enhancing the heat releasing property and the structural strength, and the structure of the module is simplified and the production cost is steeply reduced. Further, heat generated from a heat generating part such as the semiconductor element 7 and the like mounted on the substrate is transmitted outside of the system quickly through the high thermal conductive silicon nitride substrate 10. Therefore, the heat releasing property of the module is extremely excellent.

Further, since the high thermal conductive silicon nitride substrate 10 having a high strength and a high toughness is used, a maximum deflecting of the module can be secured at a high level. Therefore, cracking due to fastening does not occur even when the module is fixed to an apparatus casing 9 by an attaching screw 6a in the assembly process. As a result, a semiconductor apparatus using the semiconductor module can be mass-produced with a low cost and a high production yield.

Since toughness of the high thermal conductive silicon nitride substrate 10 is high, cracking does not occur on the connecting portion between the substrate 10 and the metal circuit plates or the metal plates 4a, 4b even if the heat cycles are applied. As a result, the heat cycle resistance property is remarkably improved, and a semiconductor apparatus excellent in durability and reliability can be provided.

Further, since the silicon nitride substrate 10 having a high thermal conductivity is used, degradation in heat resistance property is small and an excellent heat releasing property is demonstrated even if the semiconductor element 7 directing to a high output use or a high integrated use is mounted.

In particular, since mechanical strength of the silicon nitride substrate itself is excellent, when required mechanical strength properties are assumed to be constant, the thickness of the substrate can be reduced as compared with the case in which other ceramic substrate is used. Namely, in a conventional semiconductor module, the thickness of a ceramic substrate is generally from 0.6 to 1.0 mm, however, by using the high thermal conductive silicon nitride substrate used in the present invention, the thickness can be reduced as thin as to 0.1 mm to 0.6 mm. Since the thickness of the substrate can be reduced as described above, the heat resistance can be further reduced, and the heat releasing property can be further improved. Further, since it is possible to cope with the required mechanical properties even with a substrate thinner than a conventional substrate, production cost of the substrate can be reduced.

Then, by bonding metal plates for integration on both surfaces of two high thermal conductive silicon nitride substrates having a thickness of 0.3 mm and 0.6 mm respectively prepared as the above-described samples 1 to 51 by using the direct bonding method or the active metal method for forming multi-layered structure, silicon nitride circuit boards were produced respectively.

Figure 5:
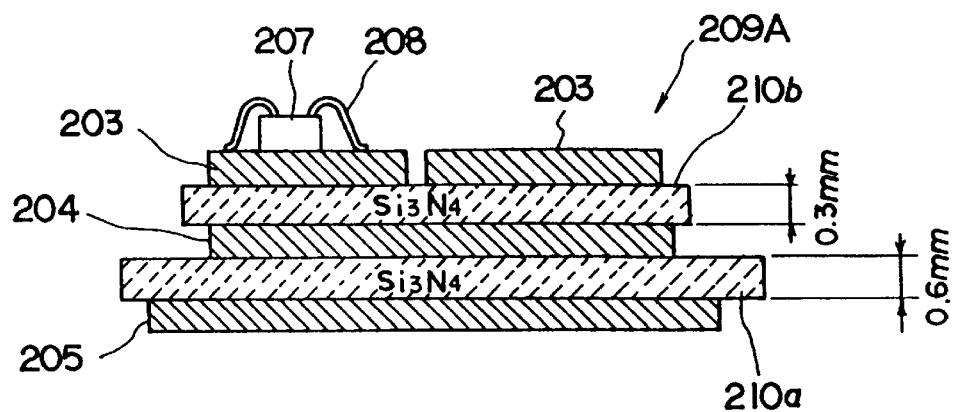
FIG. 5 is a cross-sectional view showing a structure of a silicon nitride circuit board according to one embodiment of the present invention.

FIG. 5 is a cross-sectional view showing a structure of a silicon nitride circuit board according to one embodiment of the present invention.

In the FIG. 5, two high thermal conductive silicon nitride substrates 210a, 210b are integrally bonded through a copper plate 204 as the metal plate, and copper plates 203 as the metal plates are bonded to the front surface of the high thermal conductive silicon nitride substrate 210b. On the other hand, a copper plate 205 is also bonded to the rear surface of the high thermal conductive silicon nitride substrate 210a in the same manner, thus the silicon nitride circuit board 209A is constituted.

The copper plates 203, 204, 205 in the silicon nitride circuit board 209A are bonded to the high thermal conductive silicon nitride substrates 210a, 210b by the direct bonding method, so-called DBC method. When such a DBC method is used for the copper plates 203, 204, 205, it is preferable to use copper such as tough pitch copper containing oxygen in a proportion of 100 to 3000 ppm, and it is also possible to use oxygen free copper of which surface is oxidized. Instead of a simple plate of copper and copper alloy, there can be also used a clad plate formed by cladding copper material with other metal member, at least surface portion of the clad plate to be contacted with the high thermal conductive silicon nitride substrates 210a, 210b is constituted by the copper material.

The copper plates 203 bonded to the front surface of the highly thermal conductive silicon nitride substrate 210b are members which become a mounting portion of a semiconductor part and the like, and patterned into a predetermined circuit form. A semiconductor element 207 is solder-bonded to a predetermined site of the copper plate 203. An electrode portion of the semiconductor element 207 and an electrode portion of the copper plate 203 are electrically connected by a bonding wire 208. The copper plate 205 bonded to the rear surface of the high thermal conductive silicon nitride substrate 210a is a member for preventing a bending and the like of the high thermal conductive silicon nitride substrate 210a in bonding operation. The copper plate 205 is bonded and formed on approximately whole rear surface of the high thermal conductive silicon nitride substrate 210a in condition that is separated around the center into two parts. The thickness of the copper plate 205 on the rear surface may be the same as that of the copper plate 203 which becomes the mounting portion of a semiconductor part and the like. However, it is preferable to use a copper plate having a thickness corresponding to 70 to 90% of the thickness of the copper plate 203.

Figure 6:
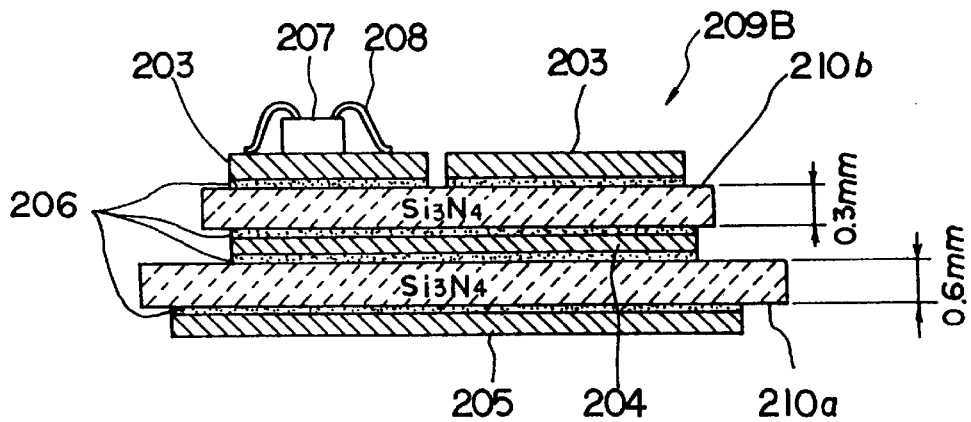
FIG. 6 is a cross-sectional view of a silicon nitride circuit board according to another embodiment of the present invention.
Figure 7:
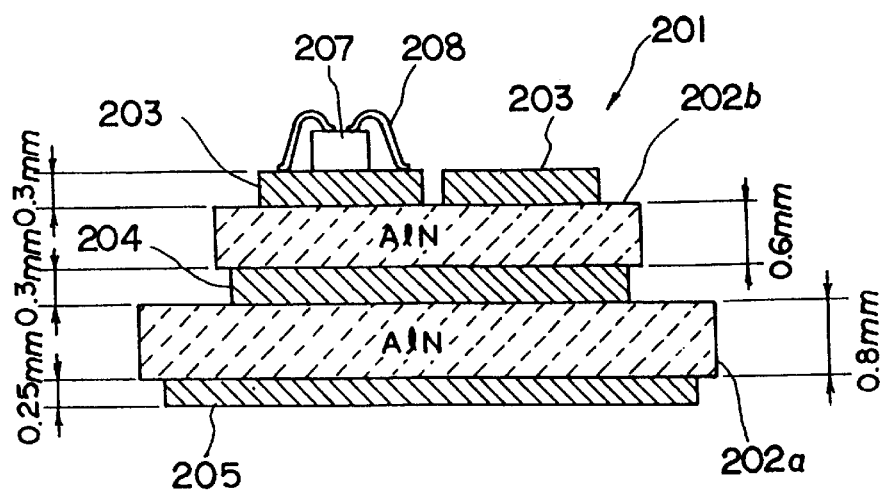
FIG. 7 is a cross-sectional view showing a structure of a conventional ceramic circuit board.

Though the silicon nitride circuit board 209A shown in FIG. 5 is obtained by bonding the copper plates 203, 204, 205 onto two high thermal conductive silicon nitride substrates 210a, 210b by the DBC method, however, a silicon nitride circuit board 209B obtained by bonding the copper plates 203, 204, 205 onto two high thermal conductive silicon nitride substrates 210a, 210b by the active metal method may also be permissible as shown in FIG. 6. The above-described active metal method is a method in which the copper plates 203, 204, 205 are bonded to two high thermal conductive silicon nitride substrates 210a, 210b through a brazing material (hereinafter, referred to as active metal-containing brazing material) layer containing at least one active metal selected from, for example, Ti, Zr, Hf, Nb and the like.

Each of the silicon nitride circuit boards 209A, 209B as described above is formed in a multi-layered structure in which two high thermal conductive silicon nitride substrates 210a, 210b to which metal plates 203, 204, 205 such as copper circuit plates and the like are bonded by the direct bonding method or active metal method are multi-layered through the metal plates 203, 204, 205. Therefore, it becomes possible to perform a three-dimensional assembly for the module, so that the circuit board can be miniaturized while securing an enlarged area for the mounting portion and the circuit constituting portions, and a small-sizing and a high-density mounting can be accomplished.

Further, by providing the plural-layered structure of the high thermal conductive silicon nitride substrates 210a, 210b having metal plates 203, 204, 205 such as a copper plate, a package and the like can be produced. In addition, since a metal plate such as a copper plate is used as the circuit constituting portions, current loss can be improved as compared with a conventional plural-layered package, and the structure of the present invention can be applied to a high frequency type semiconductor element and a heavy current type semiconductor element.

Then, specific examples and evaluation results are described below.

EXAMPLE 5

As a high thermal conductive silicon nitride substrate, high thermal conductive silicon nitride substrates 210a, 210b having a thickness of 0.3 mm and 0.6 mm respectively which carry on the surface an oxide layer ($SiO_2$ layer) having a thickness of 4 μm were prepared by adopting silicon nitride substrates corresponding to the samples 1 to 51 and by oxidizing them. Further, copper plates 203, 204 having a thickness of 0.3 mm and metal plates 205 having a thickness of 0.25 mm in a predetermined form made of tough pitch copper (oxygen content: 300 ppm) were prepared and formed by the pressing process.

Then, as shown in FIG. 5, three copper plates 203, 204, 205 were directly contacted and placed on both surfaces of the high thermal conductive silicon nitride substrates 210a, 210b to form a composite. The composite was heated for bonding at 1348 K in a nitrogen gas atmosphere, thereby to obtain an intended silicon nitride circuit board 209A.

On the other hand, as a comparative example, an aluminum nitride circuit board of the comparative example was produced in the same manner as in Example 5 except that aluminum nitride substrates 202a and 202b having a thickness of 0.8 mm and 0.6 mm respectively were used instead of the above-described high thermal conductive silicon nitride substrates 210a, 210b.

Thus obtained silicon nitride circuit board of Example 5 and the aluminum nitride circuit board of comparative example were subjected to the heat cycle test (TCT: 233 K×30 minutes+RT×10 minutes+398 K×30 minutes is set to one cycle), and ratios of the cracking formation occurred on the ceramic substrates were measured. As a result, in the silicon nitride circuit board of Example 5, no cracking occurred even after 100 cycles of TCT. On the other hand, in the aluminum nitride circuit board of comparative example, the cracking occurred on 5 to 9% of the ceramic substrates after 100 cycles of TCT.

EXAMPLE 6

As a high thermal conductive silicon nitride substrate, high thermal conductive silicon nitride substrates 210a, 210b having a thickness of 0.3 mm and 0.6 mm respectively corresponding to the samples 1 to 51 were prepared. Further, copper plates 203, 204 having a thickness of 0.3 mm and copper plates 205 having a thickness of 0.25 mm respectively having predetermined forms were prepared and formed by the pressing process in the same manner as in Example 5.

A paste prepared from an active metal-containing brazing material having a composition of In:Ag:Cu:Ti= 14.0:59.0:23.0:4.0 was applied on both surfaces of the high thermal conductive silicon nitride substrates 210a, 210b. The copper plates 203, 204, 205 were laminated and placed through this applied layer to form a composite. Then, the composite was heated for integration in a nitrogen gas atmosphere, thereby to obtain an intended plural-layered silicon nitride circuit board 209B.

Thus obtained plural-layered silicon nitride circuit board 209B was subjected to the heat cycle test under the same condition as in Example 5. As a result, excellent results as in Example 5 were obtained, and an excellent reliability of the circuit board against the cooling and heating cycles was confirmed.

In the silicon nitride circuit boards 209A, 209B of the respective examples, the high thermal conductive silicon nitride substrates 210a, 210b particularly having a sharply improved thermal conductivity in addition to a high strength and a high toughness property originally owned by a silicon nitride sintered body are used. Therefore, the heat generated from a heat-generating part such as the semiconductor element 207 and the like mounted on the substrate is transmitted outside of the system quickly through the high thermal conductive silicon nitride substrates 210a, 210b, so that the heat releasing property of the circuit board is extremely excellent.

Further, since the high thermal conductive silicon nitride substrates 210a, 210b having a high strength and a high toughness are used, a maximum deflecting of the circuit board can be secured at a high level. Therefore, the cracking caused by fastening the circuit board in the assembling process does not occur, and a semiconductor device using the circuit board can be mass-produced with a low cost and a high production yield.

Since toughness of the high thermal conductive silicon nitride substrates 210a, 210b is high, the cracking seldom occurs on the connecting portion between the substrates 210a, 210b and the metal circuit plates or metal plates 203, 204, 205 even if the heat cycles are applied. Further, the heat cycle resistance property of the circuit board is remarkably improved, and a semiconductor device excellent in durability and reliability can be provided.

Further, since the silicon nitride substrates 210a, 210b having a high thermal conductivity are used, degradation in heat resistance property is small and an excellent heat releasing property is demonstrated even if the semiconductor element 207 directing to a high output use or a high integrated use is mounted.

Then, examples of a silicon nitride circuit board in which a high thermal conductive silicon nitride substrate and an Alumina substrate as a cheap substrate for general use are placed on the same plane are described below.

EXAMPLES 7 TO 9

5% by weight of a $Y_2O_3$ (yttrium oxide) powder having an average particle size of 0.7 μm and 1.0% by weight of a $Al_2O_3$ (alumina) powder having an average particle size of 0.5 μm as a sintering aid were added to a silicon nitride raw material powder having an average particle size of 0.55 μm containing oxygen in an amount of 1.3% by weight, impurity cation elements, Li, Na, K, Fe, Ca, Sr, Ba, Mn, and B in a total amount of 0.15% by weight and an α-phase type silicon nitride in an amount of 97%. The resulted mixtures were subjected to wet mixing in ethyl alcohol for 24 hours using, then dried to prepare raw material powder mixtures. Then, an organic binder in a predetermined amount was added to the resulted raw material powder mixtures, and uniformly mixed. Then, the raw material mixtures were press-molded under a molding pressure of 1000 kg/cm², thereby to produce a lot of molded bodies each having a size of length 80 mm×width 50 mm×thickness 1 to 5 mm. Then, the resulted molded bodies were degreased in a gas atmosphere at 700° C. for 2 hours. Then, these degreased bodies were subjected to compacting sintering by maintaining the degreased bodies in a nitrogen gas atmosphere under pressure of 7.5 atom at 1900° C. for 6 hours. Then, cooling rates of the sintered bodies until the inner temperature of the sintering furnace lowered to 1500° C. were regulated to reach 100° C./hr respectively by controlling electric current to a heating apparatus equipped to the sintering furnace thereby to gradually cool the sintered bodies. Further, the resulted respective sintered bodies were subjected to an abrasion process to prepare silicon nitride ($Si_3N_4$) substrates for Examples 7 to 9, each having a thermal conductivity k of 70 w/m·k and a thickness of 0.4 mm, 0.6 mm and 0.8 mm, respectively.

On the other hand, as the cheap substrate for general use having a thermal conductivity of less than 60 w/m·k, alumina ($Al_2O_3$) substrates for Examples 7 to 9, having a thermal conductivity k of 20 w/m·k and the same thickness were prepared as for the above-described $Si_3N_4$, substrate.

Figure 8:
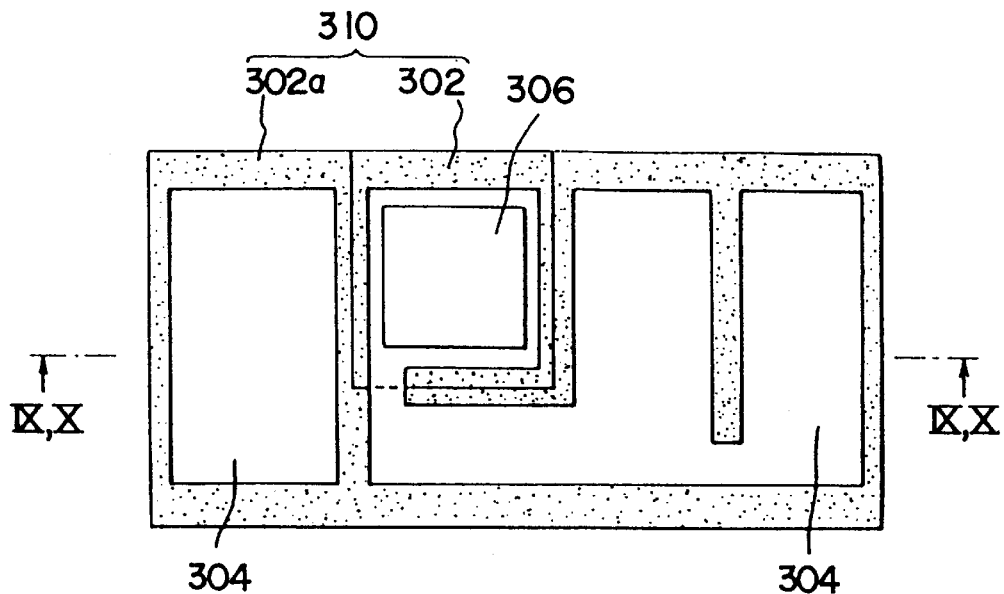
FIG. 8 is a plan view showing a constitution example of a silicon nitride circuit board according to the present invention.
Figure 9:
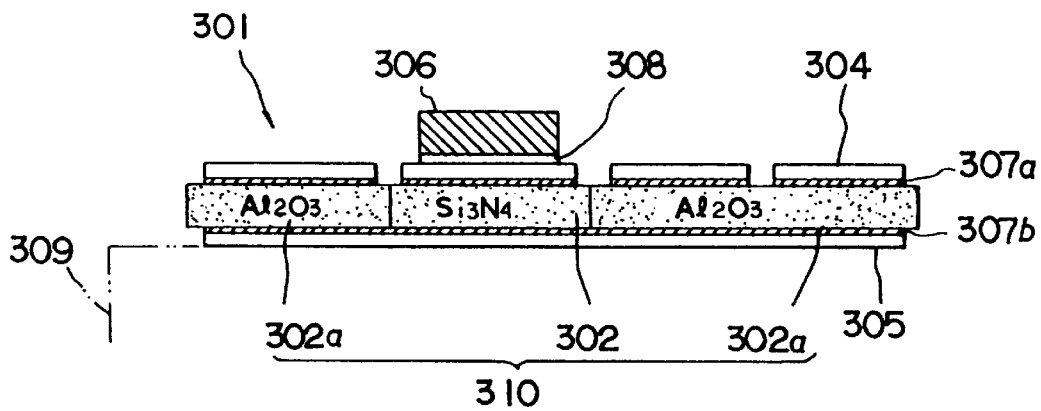
FIG. 9 is a cross-sectional view showing one example of a silicon nitride circuit board according to the present invention, and is a cross-sectional view taken in the direction of the arrows along the line IX—IX in FIG. 8.

As shown in FIGS. 8 and 9, a $Si_3N_4$ substrate 302 and a $Al_2O_3$ substrate 302a each having the same thickness were combined on the same plane to form complex substrates 310 respectively. Namely, the $Si_3N_4$ substrate 302 is placed on a part to which a semiconductor element 306 is mounted, while the $Al_2O_3$ substrate 302a is placed on the other parts, thereby to form a complex substrate 310.

As shown in FIGS. 8 and 9, a brazing material having a composition of Ag 30 wt. %—Cu 65 wt. %—Ti 5 wt. % was screen-printed on positions of the front surfaces of the silicon nitride substrate 302 and the alumina substrate 302a to which a circuit layer is formed and positions on the rear surfaces of the substrates to which a metal plate (copper plate) is bonded. The printed brazing material are dried to form active metal brazing material layers 307a, 307b having a thickness of 20 μm. Copper circuit plates 304 each having a thickness of 0.3 mm and a copper plate (backing copper plate or rear copper plate) 305 having a thickness of 0.25 mm each composed of tough pitch electrolytic copper are contacted and placed on predetermined positions of the active metal brazing material layers 307a, 307b to form composites. Then, the composites were maintained at 850° C. in vacuum for 10 minutes in the contacting condition to make bonded articles. Then, the respective bonded articles were subjected to etching treatment, to form predetermined patterns (circuit layers). Further, the semiconductor element 306 was bonded through a solder layer 308 to a center portion of the copper circuit plate 304 bonded to the upper surface of the $Si_3N_4$ substrate 302, thereby to make a lot of silicon nitride circuit boards 301 of Examples 7 to 9

COMPARATIVE EXAMPLE 1

A ceramic circuit board of Comparative Example 1 was produced by integrally bonding the copper circuit plates and the metal plate to the surface of the substrate by the active metal method likewise in Examples 7 to 9, except that a ceramic substrate composed only of an aluminum nitride (AlN) sintered body having a thickness of 0.8 mm and a thermal conductivity k of 182 w/m·k was used instead of the complex substrate 310 composed of the $Si_3N_4$ substrate 302 and the $Al_2O_3$ substrate 302a used in Examples 7 to 9.

Maximum deflection and bending resistance strength of thus prepared circuit boards of Examples 7 to 9 and Comparative Example 1 were measured. As a result, it was found that the silicon nitride circuit boards 301 of Examples 7 to 9 had 2-fold or more of the maximum deflection and the bending resistance strength as compared with those of the circuit board of Comparative Example 1 in which only a conventional aluminum nitride substrate was used. Further, it was also confirmed that the deflection and the bending resistance strength are improved with reduction of the thickness of the silicon nitride circuit boards. Further, it was confirmed that heat releasing property of whole circuit board can be further improved by reduction of the thickness of the substrate since the heat resistance can be lowered.

The respective silicon nitride circuit boards of the examples were bonded on a heat sink 309 as shown in FIG. 9, then, mounted on a board in assembly process. As a result, a semiconductor device using the circuit board could be produced with a high production yield without causing cracking due to the fastening operation for fixing the circuit board.

Further, the respective circuit boards were subjected to a heat cycle resistance test in which a temperature increasing and decreasing cycle wherein the test sample was heated from −45° C. to a room temperature (RT), subsequently heated from the room temperature to +125° C., then, again cooled to −45° C. via room temperature was repeated and cycle number until cracking occurred on substrate portion was measured.

As a result, it was found that there was no cracking of the $Si_3N_4$ substrate and the $Al_2O_3$ substrate and no releasing or peeling of the metal circuit board (Cu circuit board) or the metal plate, and an excellent heat cycle resistance property was manifested even after 1000 cycles elapsed, in the silicon nitride circuit boards of Examples 7 to 9. On the other hand, it was confirmed that the circuit board of Comparative Example 1 caused cracking after 100 cycles and had a low durability.

EXAMPLE 10

The $Si_3N_4$ substrates having a thickness of 0.4 mm, 0.6 mm and 0.8 mm respectively and a thermal conductivity k of 70 w/m·k, which were prepared in Examples 7 to 9, were heated in an oxidizing furnace at a temperature of 1300° C. for 12 hours for oxidation of whole surface of the substrate and oxide layers having a thickness of 2 μm were formed. The oxide layer was formed of a $SiO_2$ film.

On the other hand, the $Al_2O_3$ substrates having a thickness of 0.4 mm, 0.6 mm and 0.8 mm respectively and a thermal conductivity k of 20 w/m·k, which were prepared in Examples 7 to 9, were obtained.

Figure 10:
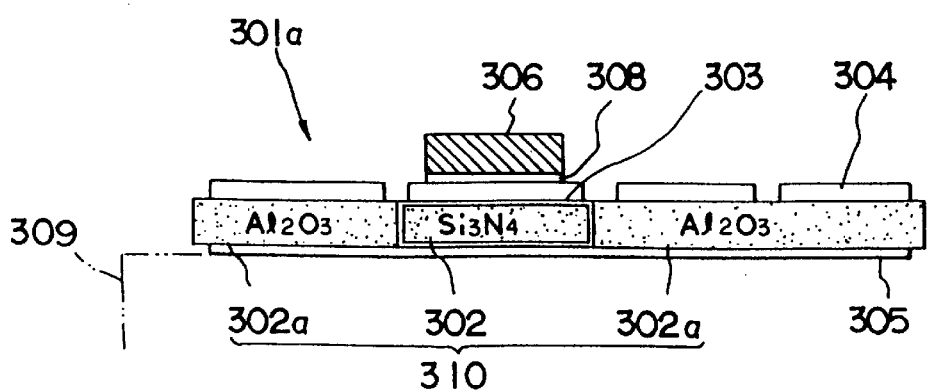
FIG. 10 is a cross-sectional view showing another example of a silicon nitride circuit board according to the present invention, and is a cross-sectional view taken in the direction of the arrows along the line X—X in FIG. 8.

As shown in FIG. 10, the $Si_3N_4$ substrate 302 and the $Al_2O_3$ substrate 302a having the same thickness were combined on the same plane to form complex substrates 310 respectively. Namely, the $Si_3N_4$ substrate 302 was placed on a position to which the semiconductor element was mounted, while, the $Al_2O_3$ substrate 302a was placed on the other position, thereby to form the complex substrate 310.

Then, on the front side of the complex substrate 310 in which each $Al_2O_3$ substrate 302a was combined with the $Si_3N_4$ substrate 302 on which the oxide layer 303 was formed, copper circuit plates each composed of a tough pitch electrolytic copper having a thickness of 0.3 mm were contacted and placed, while, on the rear side, a metal plate composed of a tough pitch copper having a thickness of 0.25 mm was contacted and placed as a backing material, to form a laminate. Then, by inserting this laminate in a heating oven at 1075° C. in which a nitrogen gas atmosphere was controlled and by heating for 1 minute, the metal circuit plates or the metal plate were directly bonded to both surfaces of respective complex substrates 310. Further, the semiconductor element was solder-bonded to the copper circuit plate, thereby to prepare the silicon nitride circuit boards 301a of Example 10, respectively.

Each silicon nitride circuit boards 301a has a structure in which the oxide layer 303 composed of $SiO_2$ is formed on whole surface of the $Si_3N_4$ substrate 302, the copper circuit plates 304 as the metal circuit plates are directly bonded to the front surface of the complex substrate 310 comprising the $Si_3N_4$ substrate 302 and the $Al_2O_3$ substrate 302a, while, the metal plate 305 as the rear copper plate is directly bonded, and further, the semiconductor element 306 is integrally bonded through the soldering layer 308 formed on a predetermined position of the copper circuit plates bonded to the front side of the $Si_3N_4$ substrate 302, as shown in FIG. 10. When the copper circuit plates 304 or the metal plate 305 are bonded to both surfaces of the complex substrate 310, the metal plate 305 as the backing copper plate is effective since it contributes to heat releasing acceleration and bending prevention.

The maximum deflection of the silicon nitride circuit board of Example 10 in which the circuit layers were formed by the direct bonding method as described above was from 0.8 to 1.6 mm, the bending resistance strength was from 550 to 900 MPa, and there were obtained physical properties equivalent to those in Examples 7 to 9 wherein the circuit boards were formed by the active metal method. Further, even after 1000 cycles elapsed in the heat cycle resistance test, there was no cracking of the $Si_3N_4$ substrate and the $Al_2O_3$ substrate and no releasing of the metal circuit plates and the metal plate, and an excellent heat cycle resistance property was manifested.

INDUSTRIAL APPLICABILITY

As described above, according to the semiconductor module of the present invention, since a high thermal conductive silicon nitride substrate having a sharply improved thermal conductivity in addition to a high strength and a high toughness property originally owned by a silicon nitride sintered body is used, cracking seldom occurs on the substrate by impacts to be applied in heat cycles and construction, and the semiconductor module does not need both a rear copper plate (backing metal plate) and a heat sink plate for enhancing a heat releasing property and a structural strength. Therefore, the structure of the semiconductor module is simplified and the production cost is steeply reduced, and further, the semiconductor module can be miniaturized and a high-density mounting becomes possible.

Further, in the silicon nitride circuit board of the present invention, a plurality of high thermal conductive silicon nitride substrates to which metal plates such as copper circuit plates and the like are bonded are plural-layered through the metal plate. Therefore, it becomes possible to perform a three-dimensional assembly, so that the circuit board can be miniaturized with enlarging area of a mounting portion and circuit constituting portions, and a small-sizing and a high-density mounting can be accomplished.

Further, heat generated from a heat-generating part such as a semiconductor element and the like mounted on the substrate is transmitted outside of the system quickly via the high thermal conductive silicon nitride substrate. Therefore, the heat releasing property of the module is extremely excellent. Further, since the silicon nitride substrate having a high strength and a high toughness is used, a maximum deflecting of the module or circuit board can be secured at a high level. Therefore, cracking due to fastening of the module in the assembly process does not occur, and a semiconductor device using the semiconductor module can be mass-produced with a low cost and a high production yield.

According to the silicon nitride circuit board of the present invention, since a high thermal conductive silicon nitride substrate particularly having a steeply improved thermal conductivity in addition to a high strength and a high toughness property originally owned by a silicon nitride sintered body is placed on a part to which a structural strength and a heat releasing property are particularly required, while a cheap substrate for general used which can be easily produced such as an alumina substrate and a resin substrate is placed on the other parts, and both the substrates are placed on the same plane to form a complex substrate, the production cost of the circuit board is low. Further, by placing the silicon nitride substrate which has a high strength and a high toughness property on a position to which a structure strength is required, a maximum deflection of the circuit board can be secured at a high level. Therefore, cracking due to fastening of the circuit board in the assembly process does not occur, and a semiconductor device using the circuit board can be mass-produced with a low cost and a high production yield.

What is claimed is:

1. A semiconductor module comprising:
   a high thermal conductive silicon nitride substrate having a thermal conductivity of 60 w/m·k or more,
   a semiconductor element mounted on said high thermal conductive silicon nitride substrate,
   metal circuit plates bonded to said high thermal conductive silicon nitride substrate at a side to which the semiconductor element is mounted, and
   a single metal plate bonded to said high thermal conductive silicon nitride substrate at a side to which the semiconductor element is not mounted but an apparatus casing or a mounting board is bonded, said single metal plate having a thickness of more than two times that of said metal circuit plate.

2. The semiconductor module according to claim 1, wherein said high thermal conductive silicon nitride substrate is made of a silicon nitride crystal phase and a grain boundary phase, and a ratio of the crystal compound phase in the grain boundary phase is 20% or more based on the whole grain boundary phase.

3. The semiconductor module according to claim 1, wherein said high thermal conductive silicon nitride substrate is made of a silicon nitride crystal phase and a grain boundary phase, and a ratio of the crystal compound phase in the grain boundary phase is 50% or more based on the whole grain boundary phase.

4. The semiconductor module according to claim 1, wherein said high thermal conductive silicon nitride substrate contains impurity cationic elements of Li, Na, K, Fe, Ca, Sr, Ba, Mn and B in a total amount of 1.0% by weight or less.

5. The semiconductor module according to claim 1, wherein said metal circuit plates and said single metal plate are directly bonded to said high thermal conductive silicon nitride substrate without forming a metallized layer or brazing material layer.

6. The semiconductor module according to claim 1, wherein said metal circuit plates and said single metal plate are bonded to said high thermal conductive silicon nitride substrate through a brazing material containing active metal.

7. A silicon nitride circuit board comprising:
   a plurality of high thermal conductive silicon nitride substrates each having a thermal conductivity of 60 w/m·k or more and
   a metal plate which is bonded to said high thermal conductive silicon nitride substrate, and has a portion at which a plurality of said high thermal conductive silicon nitride substrates are laminated through said metal plate to form plural-layered structure.

8. The silicon nitride circuit board according to claim 9, wherein said high thermal conductive silicon nitride substrate is made of a silicon nitride crystal phase and a grain boundary phase, and a ratio of the crystalline compound phase in the grain boundary phase is 20% or more based on the whole grain boundary phase.

9. The silicon nitride circuit board according to claim 7, wherein said high thermal conductive silicon nitride substrate is made of a silicon nitride crystal phase and a grain boundary phase, and a ratio of the crystalline compound phase in the grain boundary phase is 50% or more based on the whole grain boundary phase.

10. The silicon nitride circuit board according to claim 7, wherein said high thermal conductive silicon nitride substrate contains impurity cation elements of Li, Na, K, Fe, Ca, Sr, Ba, Mn and B in a total amount of 1.0% by weight or less.

11. The silicon nitride circuit board according to claim 7, wherein said metal circuit plates and the metal plate are bonded to said high thermal conductive silicon nitride substrate by a direct bonding method.

12. The silicon nitride circuit board according to claim 7, wherein said metal circuit plates and the metal plate are bonded to said high thermal conductive silicon nitride substrate by an active metal brazing method.

13. A silicon nitride circuit board, wherein a high thermal conductive silicon nitride substrate having a thermal conductivity of 60 w/m·k or more and a substrate having a thermal conductivity of less than 60 w/m·k are placed on the same plane, and metal circuit plates are bonded to at least said high thermal conductive silicon nitride substrate having a thermal conductivity of 60 w/m·k or more.

14. The silicon nitride circuit board according to claim 13, wherein said high thermal conductive silicon nitride substrate is made of a silicon nitride crystal phase and a grain boundary phase, and a ratio of the crystalline compound phase in the grain boundary phase is 20% or more based on the whole grain boundary phase.

15. The silicon nitride circuit board according to claim 13, wherein said high thermal conductive silicon nitride substrate is made of a silicon nitride crystal phase and a grain boundary phase, and a ratio of the crystalline compound phase in the grain boundary phase is 50% or more based on the whole grain boundary phase.

16. The silicon nitride circuit board according to claim 13, wherein said high thermal conductive silicon nitride substrate contains impurity cation elements of Li, Na, K, Fe, Ca, Sr, Ba, Mn and B in a total amount of 1.0% by weight or less.

17. The silicon nitride circuit board according to claim 13, wherein said metal circuit plates and the metal plate are bonded to said high thermal conductive silicon nitride substrate by a direct bonding method.

18. The silicon nitride circuit board according to claim 13, wherein said metal circuit plates and the metal plate are bonded to said high thermal conductive silicon nitride substrate by an active metal brazing method.

19. A semiconductor module comprising:

a high thermal conductive silicon nitride substrate having a thermal conductivity of 60 w/m·k or more and made of a silicon nitride crystal phase and a grain boundary phase, wherein a ratio of the crystal compound phase in said grain boundary phase is 20% or more based on the whole grain boundary phase a semiconductor element mounted on said high thermal conductive silicon nitride substrate, metal circuit plates bonded to said high thermal conductive silicon nitride substrate at a side to which the semiconductor element is mounted, and a single metal plate bonded to said high thermal conductive silicon nitride substrate at a side to which the semiconductor element is not mounted but an apparatus casing or a mounting board is bonded.

20. The semiconductor module according to claim 19, wherein said single metal plate to be bonded to the apparatus casing or the mounting board has a thickness less than that of said metal circuit plate.

21. The semiconductor module according to claim 19, wherein said high thermal conductive silicon nitride substrate is made of a silicon nitride crystal phase and a grain boundary phase, and a ratio of the crystal compound phase in the grain boundary phase is 50% or more based on the whole grain boundary phase.

22. The semiconductor module according to claim 19, wherein said high thermal conductive silicon nitride substrate contains impurity cationic elements of Li, Na, K, Fe, Ca, Sr, Ba, Mn and B in a total amount of 1.0% by weight or less.

23. The semiconductor module according to claim 19, wherein said metal circuit plates and said single metal plate are bonded directly to said high thermal conductive silicon nitride substrate without forming a metallized layer or brazing material layer.

24. The semiconductor module according to claim 19, wherein said metal circuit plates and said single metal plate are bonded to said high thermal conductive silicon nitride substrate through a brazing material containing active metal.

* * * * *